United States Patent
An et al.

(10) Patent No.: US 12,144,210 B2
(45) Date of Patent: Nov. 12, 2024

(54) TOUCH DISPLAY DEVICE

(71) Applicant: LG Display Co., Ltd., Seoul (KR)

(72) Inventors: SuChang An, Seoul (KR); Ruda Rhe, Seoul (KR); JiHyun Jung, Seoul (KR); DeukSu Lee, Seoul (KR); JaeGyun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/320,034

(22) Filed: May 18, 2023

(65) Prior Publication Data
US 2023/0380225 A1  Nov. 23, 2023

(30) Foreign Application Priority Data

May 23, 2022 (KR) .................. 10-2022-0062586
Jul. 12, 2022 (KR) .................. 10-2022-0085613

(51) Int. Cl.
*H10K 59/126* (2023.01)
*G06F 3/041* (2006.01)
*H10K 59/40* (2023.01)
*H10K 59/88* (2023.01)

(52) U.S. Cl.
CPC ......... *H10K 59/126* (2023.02); *G06F 3/0412* (2013.01); *G06F 3/04164* (2019.05); *H10K 59/40* (2023.02); *H10K 59/88* (2023.02); *G06F 2203/04107* (2013.01)

(58) Field of Classification Search
CPC .... G06F 3/0412; G06F 3/04164; G06F 3/041; G06F 3/044; G06F 3/0446; G06F 3/0443; G06F 2203/04111; G06F 2203/04103; G06F 2203/04107; G06F 2203/04112; G06F 3/0448; H10K 50/844; H10K 59/40; H10K 59/126; H10K 59/88; H10K 59/131; H10K 59/873
See application file for complete search history.

(56) References Cited

U.S. PATENT DOCUMENTS

| | | |
|---|---|---|
| 2018/0203555 A1 | 7/2018 | Miyamoto |
| 2019/0079623 A1* | 3/2019 | Kim .................... G06F 3/04164 |
| 2021/0064172 A1* | 3/2021 | Lee ......................... H10K 50/84 |
| 2021/0141479 A1 | 5/2021 | Lee et al. |
| 2022/0066613 A1* | 3/2022 | Yuan ........................ G06F 3/044 |
| 2022/0352286 A1 | 11/2022 | Mugiraneza et al. |

FOREIGN PATENT DOCUMENTS

CN 114256314 A * 3/2022

* cited by examiner

Primary Examiner — Koosha Sharifi-Tafreshi
(74) Attorney, Agent, or Firm — Seed IP Law Group LLP

(57) ABSTRACT

The present disclosure provides a touch display device having a structure in which at least one touch electrode is disposed on an encapsulation layer, and including a noise shielding layer located between a layer in which the signal line under the encapsulation layer is disposed and a layer in which at least one light emitting element is disposed. The noise shielding layer can block coupling between the signal line and an electrode of the light emitting element, and reduce or prevent a fluctuation in the voltage of the electrode of the light emitting element from causing noise to occur in a touch sensing signal detected by the at least one touch electrode on the encapsulation layer.

15 Claims, 16 Drawing Sheets

<Case A>

<Case B>

<Case C>

TOUCH DISPLAY DEVICE

CROSS-REFERENCE TO RELATED APPLICATION

This application claims the priority benefit of Republic of Korea Patent Application No. 10-2022-0062586, filed on May 23, 2022, and No. 10-2022-0085613, filed on Jul. 12, 2022 in the Korean Intellectual Property Office, which is incorporated herein by reference in its entirety.

BACKGROUND

Technical Field

The present disclosure relates to electronic devices, and more particularly, to touch display devices.

Description of the Related Art

In order to provide more various functions to users, touch sensing enabled display devices provide a function of detecting a touch input from a user on a display panel. Such display devices can perform a predefined operation such as presenting images, processing data, and the like based on the detected touch input.

The display devices may include, for example, a plurality of touch electrodes disposed outside or inside of a display panel. The display devices can detect a touch input by driving the plurality of touch electrodes and detecting a change in capacitance caused by the touch of a user. The display devices may include elements for display driving in addition to elements for touch sensing.

BRIEF SUMMARY

In typical touch sensing enabled display devices in the related art, touch sensing performance can be reduced due to interference caused between the elements for touch sensing and the elements for display driving.

Therefore, it is beneficial to improve the touch sensing performance in touch sensing enabled display devices by addressing the shortcomings of the devices in the related art. To address this issue, one or more embodiments of the present disclosure may provide a touch display device capable of reducing interference between at least one touch electrode and at least one electrode for display driving, which are disposed in a display panel, and improving touch sensing performance.

According to aspects of the present disclosure, a touch display device can be provided that includes: a substrate including an active area in which a plurality of subpixels are disposed and a non-active area located outside of the active area; a plurality of data lines disposed over the substrate; a plurality of light emitting elements located over the plurality of data lines, each of the plurality of light emitting elements including an anode layer, an emission layer, and a cathode layer; an encapsulation layer disposed on the plurality of light emitting elements; a plurality of touch electrodes disposed on the encapsulation layer; and a noise shielding layer located between a layer in which the plurality of data lines are disposed and a layer in which the plurality of light emitting elements are disposed.

According to aspects of the present disclosure, a touch display device can be provided that includes: a substrate; a plurality of thin film transistors disposed over the substrate; a plurality of light emitting elements disposed over the plurality of thin film transistors; an encapsulation layer disposed on the plurality of light emitting elements; a plurality of touch electrodes disposed on the encapsulation layer; at least one connection pattern for electrically connecting any one of the plurality of thin film transistors to any one of the plurality of light emitting elements; and a noise shielding layer located in a layer in which the at least one connection pattern is disposed, insulated from the at least one connection pattern, and overlapping at least one, or a respective portion of the at least one, of the plurality of light emitting elements.

According to aspects of the present disclosure, a touch display device can be provided that includes: a substrate including an active area in which a plurality of subpixels are disposed and a non-active area located outside of the active area; a plurality of signal lines disposed over the substrate; a plurality of light emitting elements disposed over the plurality of signal lines; an encapsulation layer disposed on the plurality of light emitting elements; a plurality of touch electrodes disposed on the encapsulation layer; and a noise shielding layer located between a layer in which the plurality of signal lines are disposed and a layer in which the plurality of light emitting elements are disposed, overlapping at least one of the plurality of signal lines, electrically connected to the overlapped at least one signal line in a portion of the active area, and insulated from the remaining one or more signal lines except for the overlapped at least one signal line among the plurality of signal lines.

According to one or more embodiments of the present disclosure, a touch display device may be provided that is capable of reducing interference between at least one electrode or at least one signal line and at least one touch electrode, which are disposed in a display panel, and improving touch sensing performance performed by the at least one touch electrode disposed in the display panel.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
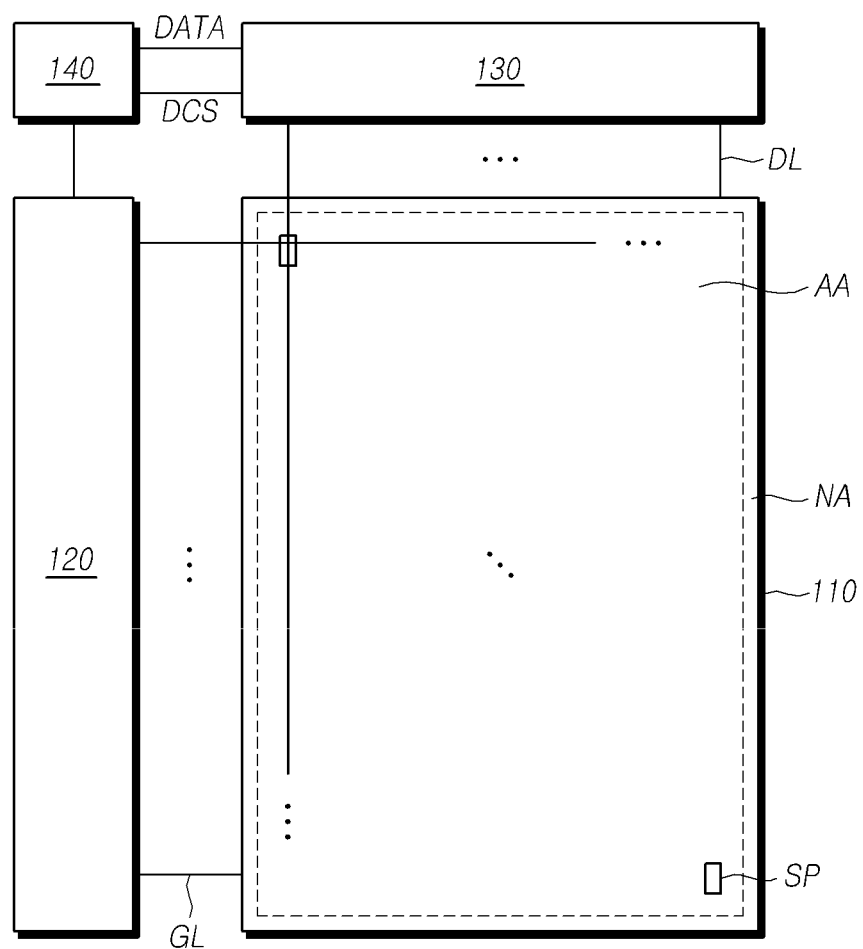
FIG. 1 illustrates an example touch display device according to aspects of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Terms, such as "first," "second," "A," "B," "(A)," or "(B)" may be used herein to describe elements of the present disclosure. These terms are used only to distinguish one element from another. For example, a first element could be termed a second element, and, similarly, a second element could be termed a first element, without departing from the scope of the present disclosure.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

Figure 2:
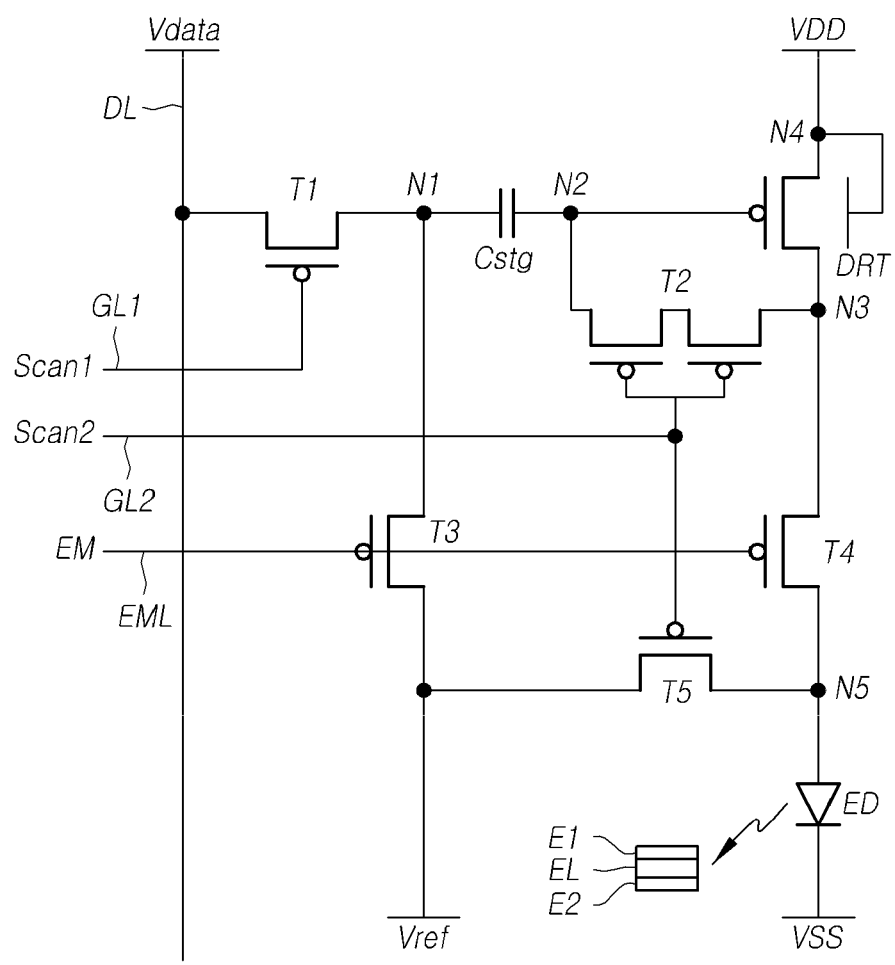
FIG. 2 illustrates an example equivalent circuit of a subpixel included in the touch display device according to aspects of the present disclosure.

FIG. 1 illustrates an example touch display device 100 according to aspects of the present disclosure. FIG. 2 illustrates an example equivalent circuit of a subpixel SP included in the touch display device 100 according to aspects of the present disclosure.

Referring to FIGS. 1 and 2, the touch display device 100 may include a display panel 110, a gate driving circuit 120, a data driving circuit 130, and a controller 140, which are configured to drive the display panel 110.

The touch display device 100 may further include elements for touch sensing in addition to these elements for display driving.

The display panel 110 may include an active area AA in which a plurality of subpixels SP are disposed, and a non-active area NA located outside of the active area AA (but not limited to this). A plurality of gate lines GL and a plurality of data lines DL may be disposed in the display panel 110. A plurality of subpixels SP may be located in areas in which the gate lines GL and the data lines DL intersect.

The gate driving circuit 120 may be controlled by the controller 140. The gate driving circuit 120 can control driving timings of the plurality of subpixels SP by sequentially outputting scan signals to the plurality of gate lines GL disposed in the display panel 110.

The gate driving circuit 120 may include one or more gate driver integrated circuits GDIC. The gate driving circuit 120 may be located in only one side or portion (e.g., a left edge, a right edge, an upper edge, a lower edge, or the like), or in two sides or portions (e.g., a left edge and a right edge, an upper edge and a lower edge, or the like) of the display panel 110 according to design requirements.

In one or more embodiments, each gate driver integrated circuit GDIC may be connected to a respective bonding pad of the display panel 110 in a tape automated bonding (TAB) type or in a chip on glass (COG) type. In one or more embodiments, each gate driver integrated circuit GDIC may be directly disposed in the display panel 110 in a gate in panel (GIP) type. In one or more embodiments, each gate driver integrated circuit GDIC may be disposed in the display panel 110 such that it is integrated with the display panel 110. In one or more embodiments, each gate driver integrated circuit GDIC may be implemented such that it is mounted on a film connected to the display panel 110 in the chip on film (COF) type.

The data driving circuit 130 can receive image data DATA from the controller 140, and convert the received image data DATA into data voltages Vdata in the form of analog. The data driving circuit 130 can output the data voltages to respective data lines DL according to timings at which scan signals through the gate lines GL are applied, and enable each subpixel SP to emit light corresponding to the image data.

The data driving circuit 130 may include one or more source driver integrated circuits SDIC. Each source driver integrated circuit SDIC may include a shift register, a latch circuit, a digital to analog converter, an output buffer, and the like.

In one or more embodiments, each source driver integrated circuit SDIC may be connected to a respective bonding pad of the display panel 110 in the tape automated bonding (TAB) type or in the chip on glass (COG) type. In one or more embodiments, each source driver integrated circuit SDIC may be directly disposed in the display panel 110. In one or more embodiments, each source driver integrated circuit SDIC may be disposed in the display panel 110 such that it is integrated with the display panel 110. In one or more embodiments, each source driver integrated circuit SDIC may be implemented in the chip on film (COF) type. In these embodiments, each source driver integrated circuit SDIC may be mounted on a film connected to the display panel 110, and be electrically connected to the display panel 110 through a line on the film.

The controller 140 can supply various control signals to the gate driving circuit 120 and the data driving circuit 130, and control operation of the gate driving circuit 120 and the data driving circuit 130.

The controller 140 may be mounted on a printed circuit board or a flexible printed circuit. The controller 140 may be electrically connected to the gate driving circuit 120 and the data driving circuit 130 through the printed circuit board or the flexible printed circuit.

The controller 140 may control the gate driving circuit 120 to output scan signals according to a respective timing set in each frame. The controller 140 can convert image data received from an external device or system (e.g., a host system) to a data signal form interpretable by the data driving circuit 130, and then supply image data DATA resulting from the converting to the data driving circuit 130.

The controller 140 can receive, in addition to input image data, several types of timing signals including a vertical synchronous signal VSYNC, a horizontal synchronous signal HSYNC, an input data enable signal DE, a clock signal CLK, and the like from the external device or system (e.g., the host system).

The controller 140 can generate several types of control signals using the several types of timing signals received from the external device or system (e.g., the host system), and output the generated signals to the gate driving circuit 120 and the data driving circuit 130.

For example, in order to control the gate driving circuit 120, the controller 140 can supply, to the gate driving circuit 120, several types of gate control signals GCS including a gate start pulse GSP, a gate shift clock GSC, a gate output enable signal GOE, and the like.

The gate start pulse GSP can be used for controlling a respective start timing of one or more gate driver integrated circuits GDIC included in the gate driving circuit 120. The gate shift clock GSC, which is a clock signal commonly inputted to one or more gate driver integrated circuits GDIC, can be used for controlling a shift timing of a scan signal. The gate output enable signal GOE can be used for designating timing information of one or more gate driver integrated circuits GDIC.

In order to control the data driving circuit 130, the controller 140 can supply, to the data driving circuit 130, several types of data control signals DCS including a source start pulse SSP, a source sampling clock SSC, a source output enable (SOE) signal, and the like.

The source start pulse SSP can be used for controlling a respective data sampling start timing of one or more source driver integrated circuits SDIC included in the data driving circuit 130. The source sampling clock SSC may be a clock signal used for controlling a respective sampling timing of one or more source driver integrated circuits SDIC. The source output enable (SOE) signal can be used for controlling output timings of the data driving circuit 130.

The touch display device 100 can supply several types of voltage or current to the display panel 110, the gate driving circuit 120, the data driving circuit 130, and the like, or may further include a power management integrated circuit for controlling several types of voltage or current to be supplied.

Each subpixel SP may be an area defined by intersection of one or more gate lines GL and one or more data lines DL. According to a type of the display device 100, a liquid crystal layer or a light emitting element may be disposed in the subpixel SP.

In an embodiment where the touch display device 100 is an organic light emitting display device, organic light emitting diodes (OLED) and circuit elements may be disposed in the subpixels SP. By controlling current supplied to an organic light emitting diode (OLED) using circuit elements, each subpixel SP can operate to emit light at a brightness corresponding to respective image data.

In one or more embodiments, light emitting diodes (LED), micro light emitting diodes (μLED), or quantum dot light emitting diodes (QLED) may be disposed in the subpixels SP.

Referring to FIG. 2, each of a plurality of subpixels SP may include a light emitting element ED. The subpixel SP may include a driving transistor DRT configured to control driving current supplied to the light emitting element ED.

For operation of the subpixel SP, the subpixel SP may include at least one circuit element in addition to the light emitting element ED and the driving transistor DRT.

For example, the subpixel SP may include a first transistor T1, a second transistor T2, a third transistor T3, a fourth transistor T4, a fifth transistor T5, and a storage capacitor Cstg.

FIG. 2 illustrates a structure in which 6 transistors and 1 capacitor are disposed in the subpixel SP (which may be referred to as a 6T1C structure), but embodiments of the present disclosure are not limited thereto. Although P-type transistors are used in the example of FIG. 2, at least one or more of the transistors disposed in the subpixel SP may be N-type transistors.

In one or more embodiments, the transistors disposed in the subpixel SP may include a semiconductor layer formed using low temperature polysilicon (LTPS) or a semiconductor layer formed using an oxide semiconductor. In one or more embodiments, one or more transistors including a semiconductor layer formed using low temperature polysilicon (LTPS) and one or more transistors including a semiconductor layer formed using an oxide semiconductor may be disposed in the subpixel SP.

The first transistor T1 may be electrically connected between a data line DL and a first node N1. The first transistor T1 can be controlled by a first scan signal Scan1 supplied through a first gate line GL1. The first transistor T1 can allow a data voltage Vdata to be applied to the first node N1.

The second transistor T2 may be electrically connected between a second node N2 and a third node N3. The second node N2 may be a gate node of the driving transistor DRT. The third node N3 may be a drain node or a source node of the driving transistor DRT. The second transistor T2 can be controlled by a second scan signal Scan2 supplied through a second gate line GL2. The second transistor T2 can perform an operation of compensating for a change in the threshold voltage of the driving transistor DRT.

The third transistor T3 may be electrically connected between a line to which a reference voltage Vref is supplied and the first node N1. The third transistor T3 can be controlled by an emission control signal EM supplied through an emission control line EML. The third transistor T3 can allow the first node N1 to be discharged or the reference voltage Vref to be applied to the first node N1.

The fourth transistor T4 may be electrically connected between the third node N3 and a fifth node N5. The fifth node N5 may be a node electrically connected to the light emitting element ED. The fourth transistor T4 can be controlled by the emission control signal EM supplied through the emission control line EML. The fourth transistor T4 can control timing at which driving current is supplied to the light emitting element ED.

The fifth transistor T5 may be electrically connected between the line to which the reference voltage Vref is supplied and the fifth node N5. The fifth transistor T5 can be controlled by the second scan signal Scan2 supplied through the second gate line GL2. The fifth transistor T5 can allow the fifth node N5 to be discharged or the reference voltage Vref to be applied to the fifth node N5.

The driving transistor DRT may be electrically connected between a fourth node N4 and the third node N3. The fourth node N4 may be electrically connected to a line to which a first driving voltage VDD is supplied. The first driving voltage VDD may be, for example, a high level driving voltage. The fourth node N4 may be the source node or the drain node of the driving transistor DRT. Hereinafter, the term "first driving voltage VDD" may refer to a voltage supplied to the source or drain node of each driving transistor DRT.

The driving transistor DRT can be controlled by a difference between a voltage at the second node N2 and a voltage at the fourth node N4. The driving transistor DRT can control driving current supplied to the light emitting element ED.

The driving transistor DRT may include a back gate electrode electrically connected to the fourth node N4. The output of a driving current by the driving transistor DRT can be stably performed by the back gate electrode electrically connected to the source node or the drain node of the driving transistor DRT. For example, the back gate electrode may be implemented using a metal layer for blocking external light from being incident into the channel of the driving transistor DRT.

The light emitting element ED may be electrically connected between the fifth node N5 and a line to which a second driving voltage VSS is supplied. The second driving voltage VSS may be, for example, a low level driving voltage.

The light emitting element ED may include an anode layer E1 electrically connected to the fifth node N5, a cathode layer E2 to which the second driving voltage VSS is applied, and an emission layer EL disposed between the anode layer E1 and the cathode layer E2. Hereinafter, the term "second driving voltage VSS" may refer to a voltage supplied to the cathode layer E2 of each light emitting element ED.

The light emitting element ED can emit light at brightness corresponding to a driving current supplied by the driving transistor DRT. The operation timing of the light emitting element ED can be controlled by the fourth transistor T4.

The operation timing of the subpixel SP shown in FIG. 2 can be briefly described as follows. A second scan signal Scan2 having a turn-on level can be supplied through the second gate line GL2. In an example where the transistors disposed in the subpixel SP are P-type transistors, the turn-on level may be a low level.

The second transistor T2 and the fifth transistor T5 can be turned on by the second scan signal Scan2 having the turn-on level.

As the second transistor T2 is turned on, the second node N2 and the third node N3 can be electrically connected. A voltage from the first driving voltage VDD after the threshold voltage of the driving transistor DRT is reflected in the first driving voltage VDD can be applied to the second node N2 through the second transistor T2. Through this process, a change in the threshold voltage of the driving transistor DRT can be compensated for.

As the fifth transistor T5 is turned on, a reference voltage Vref can be applied to the fifth node N5. The fifth node N5 can be initialized.

Thereafter, a first scan signal Scan1 having a turn-on level can be supplied through the first gate line GL1.

The first transistor T1 can be turned on by the first scan signal Scan1 having the turn-on level.

As the first transistor T1 is turned on, a data voltage Vdata can be applied to the first node N1.

The storage capacitor Cstg is in a state where the data voltage Vdata and the voltage from the first driving voltage VDD after the threshold voltage of the driving transistor DRT is reflected in the first driving voltage VDD are applied to both terminals of the storage capacitor Cstg.

Thereafter, a light emitting control signal EM having a turn-on level can be supplied through the light emitting control line EML.

The third transistor T3 and the fourth transistor T4 can be turned on.

As the third transistor T3 is turned on, a voltage at the first node N1 can be changed to a reference voltage Vref. A voltage at the second node N2 coupled to the first node N1 can be changed according to a change in the voltage at the first node N1.

The second node N2 and the fourth node N4 are in a state where a voltage from the first driving voltage VDD after the threshold voltage of the driving transistor DRT and the data voltage Vdata are reflected in the first driving voltage VDD is applied to the second node N2, and the first driving voltage VDD is applied to the fourth node N4. A difference between the voltage at the second node N2 and the voltage at the fourth node N4 may be a voltage in which the data voltage Vdata and the threshold voltage of the driving transistor DRT are reflected. A driving current corresponding to the data voltage Vdata can be supplied by the driving transistor DRT.

As the fourth transistor T4 is turned on, the driving current supplied by the driving transistor DRT can be supplied to the light emitting element ED.

The light emitting element ED can emit light at brightness according to the driving current, and the subpixel SP including the light emitting element ED can present an image corresponding to the image data.

In one or more embodiments, the touch display device 100 according to aspects of the present disclosure may include a touch sensor structure implemented in the display panel 110 for displaying an image, and provide a function of sensing the touch of a user on the display panel 110.

Figure 3:
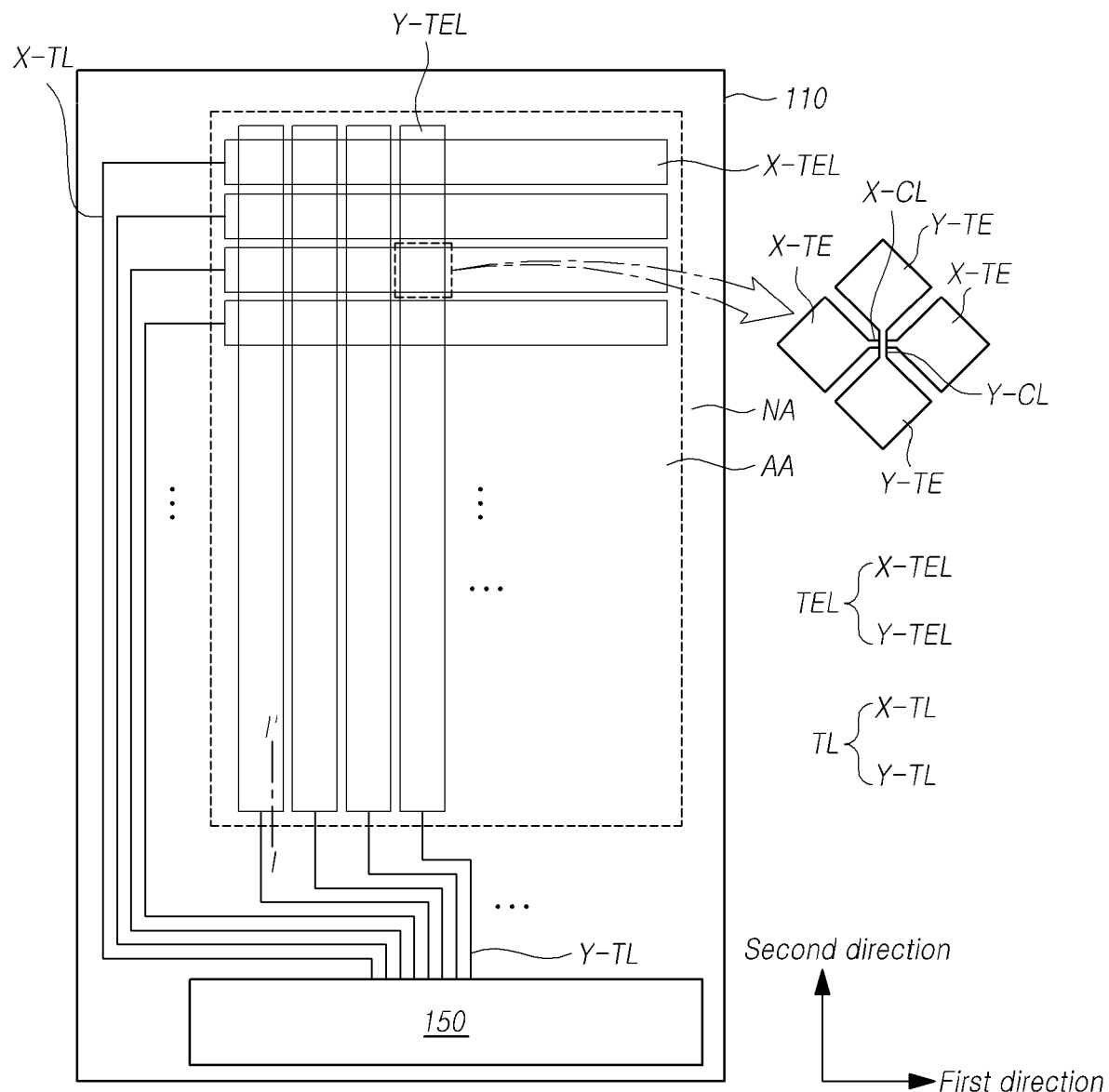
FIG. 3 illustrates an example touch sensor structure included in the touch display device according to aspects of the present disclosure.
Figure 4:
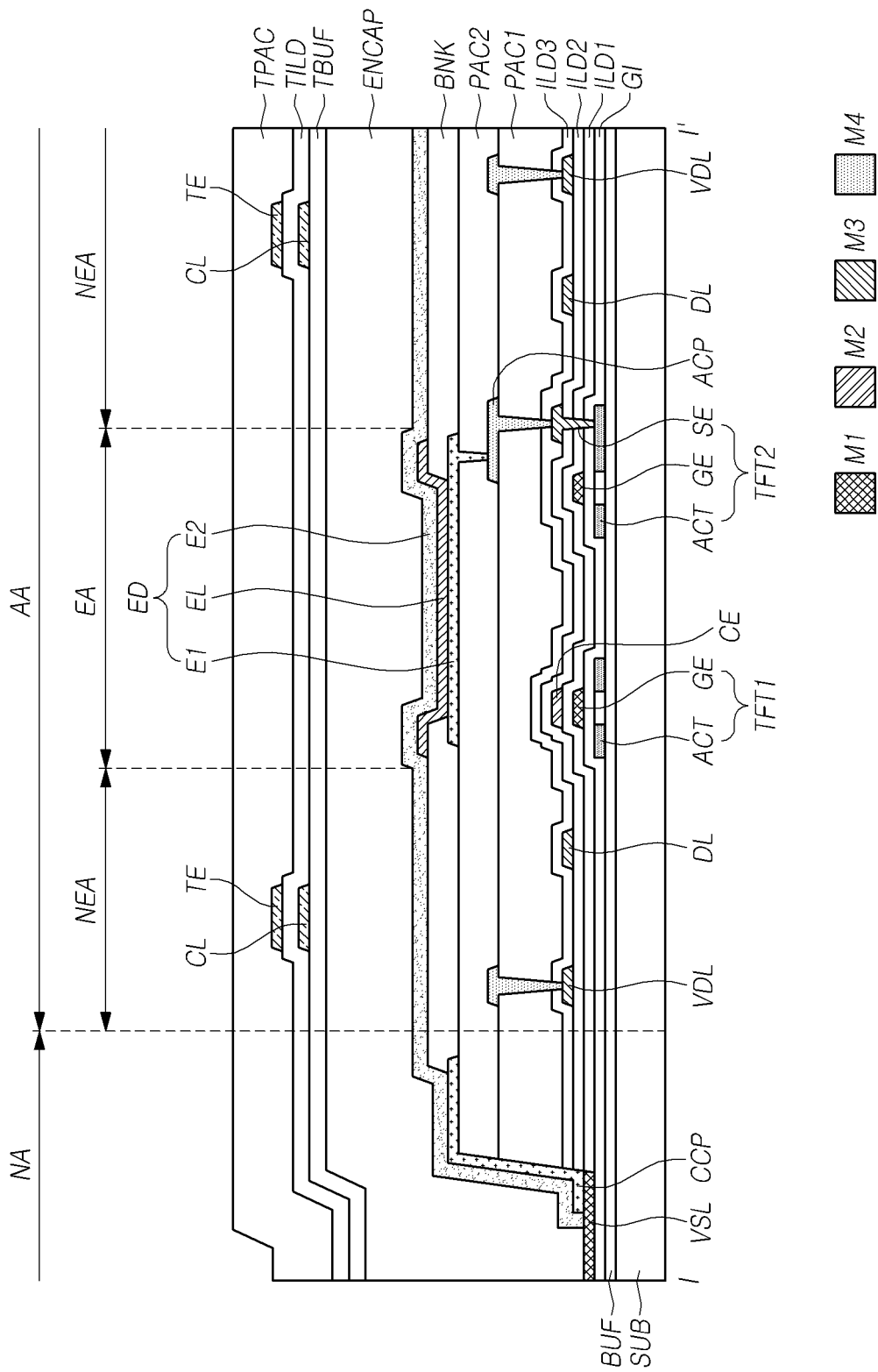
FIG. 4 is an example cross-sectional view taken along line I-I' illustrated in FIG. 3.

FIG. 3 illustrates an example touch sensor structure included in the touch display device 100 according to aspects of the present disclosure. FIG. 4 is an example cross-sectional view taken along line I-I' illustrated in FIG. 3.

Referring to FIG. 3, the touch display device 100 may include a plurality of touch electrode arrays TEL and a plurality of touch routing lines TL, which are disposed in the display panel 110. The touch display device 100 may include a touch driving circuit 150 configured to drive the plurality of touch electrode arrays TEL and the plurality of touch routing lines TL.

Each of the plurality of touch electrode arrays TEL may be electrically connected to the touch driving circuit 150 through a respective one of the plurality of touch routing lines TL. In one or more embodiments, the touch driving circuit 150 may be disposed such that it is implemented separately from other circuits, or is integrated with one or more circuits for display driving. For example, the touch driving circuit 150 may be integrated with the data driving circuit 130.

Each of the plurality of touch electrode arrays TEL may include a plurality of touch electrodes TE electrically connected to one another in one direction. In one or more embodiments, each of the plurality of touch electrode arrays TEL may include a plurality of touch electrode connection patterns CL for electrically interconnecting a plurality of touch electrodes TE to one another.

For example, each of a plurality of X-touch electrode arrays X-TEL may include a plurality of X-touch electrodes X-TE arranged along a first direction, and a plurality of X-touch electrode connection patterns X-CL for electrically interconnecting the plurality of X-touch electrodes X-TE.

Each of a plurality of Y-touch electrode arrays Y-TEL may include a plurality of Y-touch electrodes Y-TE arranged along a second direction intersecting the first direction, and a plurality of Y-touch electrode connection patterns Y-CL for electrically interconnecting the plurality of Y-touch electrodes Y-TE.

In one or more embodiments, the X-touch electrode arrays X-TEL and the Y-touch electrode arrays Y-TEL may be disposed in different layers. In one or more embodiments, the X-touch electrodes X-TE and the Y-touch electrodes Y-TE may be disposed in a same layer. In these embodiments, any one of the X-touch electrode connection patterns X-CL and the Y-touch electrode connection patterns Y-CL may be disposed on a different layer from one or more touch electrodes TE (e.g., the X-touch electrodes X-TE and/or the Y-touch electrodes Y-TE).

For example, the touch electrodes TE may have a rectangular shape, but is not limited thereto.

The touch electrodes TE may include, for example, a transparent conductive material, and be disposed without interfering with the image display function of the display panel 110.

In another example, the touch electrodes TE may include an opaque metal. In this example, the touch electrodes TE may have open areas corresponding to light emitting areas of light emitting elements ED disposed in the display panel 110. For example, the touch electrodes TE may be implemented in a mesh shape, and be disposed while avoiding the light emitting areas.

Referring to FIG. 4, a substrate SUB may include an active area AA in which a plurality of subpixels SP are disposed, and a non-active area NA located outside of the active area AA.

The active area AA may include a light emitting area EA in which light is emitted by a light emitting element ED and a non-light emitting area NEA, which is an area other than the light emitting area EA.

A buffer layer BUF may be disposed on the substrate SUB.

At least one thin film transistor TFT may be disposed on the buffer layer BUF.

The thin film transistor TFT may include an active layer ACT and a gate electrode GE. The thin film transistor TFT may include a source electrode SE and a drain electrode (not shown).

The active layer ACT may be located on the buffer layer BUF. The active layer ACT may include a semiconductor material. The active layer ACT may include amorphous silicon or polycrystalline silicon.

A gate insulating layer GI may be disposed on the active layer ACT.

The gate electrode GE may be located on the gate insulating layer GI. The gate electrode GE may be disposed using a first metal layer M1.

Several signal lines may be disposed using the first metal layer M1.

For example, at least one second power line VSL for supplying the second driving voltage VSS (see FIG. 2) may be disposed using the first metal layer M1.

For example, at least one second power line VSL may be located in the non-active area NA. In one or more implementations, a respective portion of the at least one second power line VSL or at least one other second power line VSL may be located in the active area AA.

The second power line VSL may be electrically connected to a cathode layer E2. A cathode connection pattern CCP may be located in at least a portion of an area between the second power line VSL and the cathode layer E2.

A first interlayer insulating layer ILD1 may be disposed on the gate electrode GE.

A capacitor electrode CE may be located on the first interlayer insulating layer ILD1. The capacitor electrode CE may be disposed using a second metal layer M2.

The capacitor electrode CE may form a storage capacitor Cstg with a gate electrode GE of a first thin film transistor TFT1. The first thin film transistor TFT1 may be, for example, the driving transistor DRT shown in FIG. 2.

A second interlayer insulating layer ILD2 may be disposed on the capacitor electrode CE.

The source electrode SE may be located on the second interlayer insulating layer ILD2. The source electrode SE may be electrically connected to the active layer ACT through a contact hole. The source electrode SE may be disposed using a third metal layer M3.

Several signal lines may be disposed using the third metal layer M3.

For example, at least one data line DL for supplying a data voltage Vdata may be disposed using the third metal layer M3. At least one first power line VDL for supplying the first driving voltage VDD (see FIG. 2) may be disposed using the third metal layer M3.

For example, at least one first power line VDL may be located in the active area AA. In one or more implementations, a respective portion of the at least one first power line VDL or at least one other first power line VDL may be located in the non-active area NA.

Each of the data line DL, the first power line VDL, and the second power line VSL may be arranged in various embodiments using at least one or more of the several metal layers.

Although FIG. 4 shows an example in which data lines DL and first power lines VDL are disposed using the third metal layer M3, in one or more embodiments, the data lines DL and the first power lines VDL may be disposed using the first metal layer M1 or the second metal layer M2.

In one or more embodiments, as in the example shown in FIG. 4, the first power line VDL may include a portion formed using the third metal layer M3 and a portion formed using the fourth metal layer M4. Accordingly, the resistance of the first power line VDL can be reduced.

A third interlayer insulating layer ILD3 may be disposed on the third metal layer M3.

A first planarization layer PAC1 may be disposed on the third interlayer insulating layer ILD3. The first planarization layer PAC1 may include, for example, an organic material.

A fourth metal layer M4 may be located on the first planarization layer PAC1.

At least one first power line VDL or a respective portion of the at least one first power line VDL may be formed using the fourth metal layer M4.

An anode connection pattern ACP may be disposed using the fourth metal layer M4. A second thin film transistor TFT2 and the light emitting element ED may be electrically connected by the anode connection pattern ACP. The second thin film transistor TFT2 may be, for example, the fourth transistor T4 or the fifth transistor T5 shown in FIG. 2.

A second planarization layer PAC2 may be disposed on the fourth metal layer M4. The second planarization layer PAC2 may include, for example, an organic material.

The light emitting element ED may be disposed on the second planarization layer PAC2.

An anode layer E1 of the light emitting element ED may be located on the second planarization layer PAC2.

A bank layer BNK may be disposed on the second planarization layer PAC2 while exposing a portion of the anode layer E1.

An emission layer EL may be located on the anode layer E1. The emission layer EL may be located on a portion of the bank layer BNK.

A cathode layer E2 may be located on the emission layer EL and the bank layer BNK.

The light emitting area EA may be defined by the bank layer BNK.

An encapsulation layer ENCAP may be disposed on the light emitting element ED.

The encapsulation layer ENCAP may be formed in a single layer or a multilayer. For example, the encapsulation layer ENCAP may include a first inorganic layer, an organic layer, and a second inorganic layer.

A touch sensor structure may be disposed on the encapsulation layer ENCAP.

For example, a touch buffer layer TBUF may be located on the encapsulation layer ENCAP. The touch buffer layer TBUF may include, for example, an inorganic material. In another example, the touch buffer layer TBUF may not be disposed. In this example, electrodes included in the touch sensor structure may be directly disposed on the encapsulation layer ENCAP.

At least one touch electrode connection pattern CL may be located on the touch buffer layer TBUF.

A touch insulating layer TILD may be located on the touch electrode connection pattern CL. The touch insulating layer TILD may be, for example, an organic material or an inorganic material. In an example where the touch insulating layer TILD is an organic material, a layer including an inorganic material may be further disposed between the touch insulating layer TILD and the touch electrode connection pattern CL.

At least one touch electrode TE may be located on the touch insulating layer TILD.

A touch protective layer TPAC may be disposed on the touch electrode TE.

As the touch electrode TE and the touch electrode connection pattern CL are disposed using a plurality of layers as shown in FIG. 4, the touch sensor structure including the X-touch electrode arrays X-TEL and the Y-touch electrode arrays Y-TEL as shown in FIG. 3 may be easily implemented in the display panel 110.

The touch electrode TE and the touch electrode connection pattern CL may be disposed while avoiding the light emitting area EA. The touch electrode TE and the touch electrode connection pattern CL may overlap the non-light emitting area NEA.

Since the touch electrode TE and the touch electrode connection pattern CL are disposed on the encapsulation layer ENCAP, and disposed to avoid the light emitting area EA, this touch sensor structure can be implemented in the display panel 110 while not affecting the image display function of the display panel 110.

Although not shown in FIG. 4, in one or more embodiments, a touch routing line TL connected to the touch electrode TE may be disposed along an inclined surface of the encapsulation layer ENCAP. The touch routing line TL may be located in a same layer as the touch electrode TE or a same layer as the touch electrode connection pattern CL. In one or more embodiments, the touch routing line TL may be disposed using two layers. The touch routing line TL may be electrically connected to a pad located in the non-active area NA.

In a structure in which a plurality of X-touch electrode arrays X-TEL and a plurality of Y-touch electrode arrays Y-TEL are disposed to cross each other, the touch driving circuit 150 can perform touch sensing by driving touch electrode arrays TEL through touch routing lines TL.

For example, one of the X-touch electrode arrays X-TEL and the Y-touch electrode arrays Y-TEL may be touch driving electrodes to which a touch drive signal is applied. The other of the X-touch electrode arrays X-TEL and the Y-touch electrode arrays Y-TEL may be touch sensing electrodes from which touch sensing signals are detected.

The touch driving circuit 150 can detect a change in mutual capacitance caused by a touch event from a user in a situation where different signals are applied to the X-touch electrode arrays (X-TEL) and the Y-touch electrode arrays (Y-TEL).

The touch driving circuit 150 can provide sensing data according to a detected change in mutual capacitance to the touch controller. The touch controller can detect the presence or absence of a touch event on the display panel 110 and touch coordinates based on the sensing data received from the touch driving circuit 150.

The touch electrode arrays TEL disposed in the display panel 110 may be divided into a plurality parts and be respectively disposed in a plurality of areas in the active area AA.

As the touch electrode arrays TEL are divided and disposed in each area, the load of the touch electrode arrays TEL can be reduced. When the display panel 110 has an increased area, the touch display device 100 can improve touch sensing performance while enabling the load of the touch electrode arrays TEL to be reduced.

Further, the touch display device 100 may be configured to include a structure capable of reducing or preventing interference between touch electrodes TE and electrodes for display driving, and reducing noise in a touch sensing signal.

FIGS. 5 to 12 are other example cross-sectional views taken along line I-I' illustrated in FIG. 3. In describing stackup configurations of FIGS. 5 to 12, descriptions on elements in structures of FIGS. 5 to 12 equal to or similar to those in the structure of FIG. 4 are omitted for convenience of description. Thus, the descriptions provided above with reference to FIG. 4 are provided for descriptions on those elements in the structures of FIGS. 5 to 12.

Figure 5:
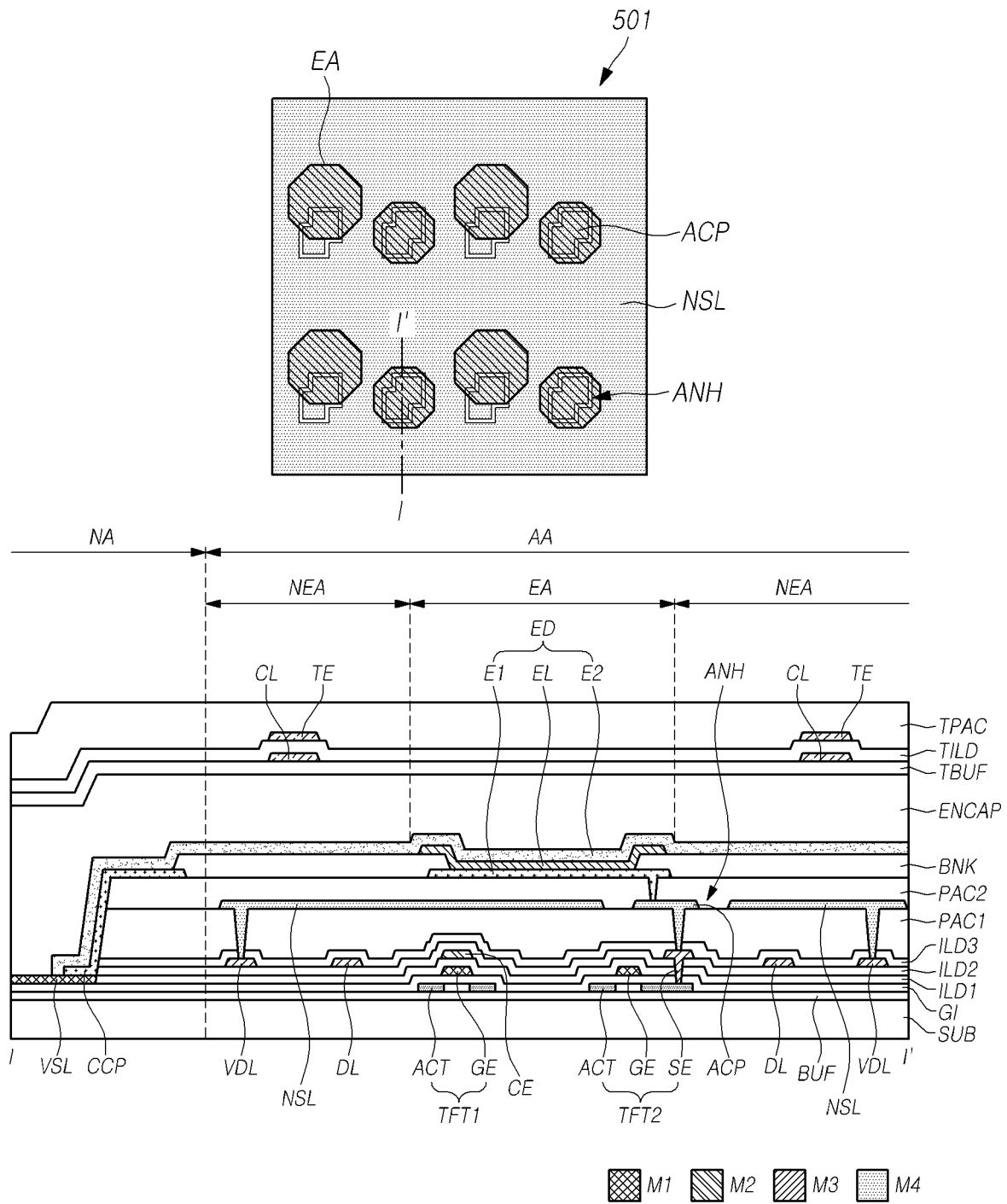
FIG. 5 is another example cross-sectional view taken along line I-I' illustrated in FIG. 3.

Referring to FIG. 5, a noise shielding layer NSL may be located between a layer in which at least one data line DL is disposed and a layer in which a light emitting element ED is disposed. A structure in a plan view indicated by reference number 501 in FIG. 5 represents an example structure in which a noise shielding layer NSL is disposed in an area including a plurality of light emitting areas EA.

The noise shielding layer NSL may be disposed using, for example, the fourth metal layer M4. The noise shielding layer NSL may be disposed in the active area AA. The noise shielding layer NSL may be disposed in an area other than areas in which one or more anode connection patterns ACP are disposed using the fourth metal layer M4. It should be noted here that the structure in the plan view indicated by reference number 501 in FIG. 5 illustrates only a layer in which the fourth metal layer M4 is disposed, and locations of the light emitting areas EA.

The noise shielding layer NSL may be disposed to be separated from one or more anode connection patterns ACP. The noise shielding layer NSL may include a plurality of anode holes ANH located in areas corresponding to anode connection patterns ACP. As shown in the structure in the plan view indicated by reference number 501 in FIG. 5, in one or more embodiments, the anode connection patterns ACP may be located inside of the anode holes ANH included in the noise shielding layer NSL.

The noise shielding layer NSL may overlap at least a respective portion of at least one data line DL. The noise shielding layer NSL may overlap at least a respective portion of at least one thin film transistor TFT. Although not shown in FIG. 5, in one or more embodiments, the noise shielding layer NSL may overlap at least a portion of at least one gate line GL.

The noise shielding layer NSL may be located under the anode layer E1 of the light emitting element ED, and be located to overlap at least one thin film transistor TFT or several signal lines, which are located between the substrate SUB and the light emitting element ED.

The noise shielding layer NSL may overlap at least a portion of the anode layer E1 of the light emitting element ED. The noise shielding layer NSL may overlap at least a portion of the cathode layer E2 of the light emitting element ED. The noise shielding layer NSL may overlap at least a portion of an area in which the anode layer E1 and the cathode layer E2 of the light emitting element ED overlap each other. As shown in the structure in the plan view indicated by reference number 501 in FIG. 5, in one or more embodiments, at least one light emitting area EA may overlap all, or a portion, of a respective anode connection pattern ACP. A portion of the light emitting area EA may overlap the noise shielding layer NSL. Since the noise shielding layer NSL overlaps a portion of the light emitting area EA, the noise shielding layer NSL may overlap the cathode layer E2 located in the light emitting area EA.

Since the noise shielding layer NSL is located between at least one signal line and the light emitting element ED, coupling of the signal line with an electrode of the light emitting element ED can be blocked. Hereinafter, the term "coupling" may mean all or any one of magnetic coupling, capacitive coupling, electromagnetic coupling, and/or the like.

For example, the noise shielding layer NSL can block coupling between the data line DL and the cathode layer E2 of the light emitting element ED. A fluctuation in a voltage applied to the cathode layer E2 due to the coupling between the data line DL and the cathode layer E2 can be reduced or prevented. Since the voltage fluctuation in the cathode layer E2 is reduced or prevented, the performance of touch sensing by at least one touch electrode TE on the encapsulation layer ENCAP can be reducing or prevented from being affected by a fluctuation in the voltage of the cathode layer E2.

For example, a constant voltage may be supplied to the noise shielding layer NSL.

In one embodiment, the first driving voltage VDD (see FIG. 2) may be supplied to the noise shielding layer NSL.

The noise shielding layer NSL may be electrically connected to a first power line VDL for supplying the first driving voltage VDD in the active area AA.

Since the first power line VDL is disposed in the active area AA, a structure in which a constant voltage is supplied to the noise shield layer NSL can be easily implemented through a connection between the noise shield layer NSL and the first power line VDL.

The noise shielding layer NSL can block coupling between a signal line and an electrode of the light emitting element ED, and reduce or prevent the performance of touch sensing by at least one touch electrode TE on the encapsulation layer ENCAP from being reduced by display driving.

The noise shielding layer NSL may be disposed in various forms using any one of several metal layers located under the light emitting element ED.

Figure 6:
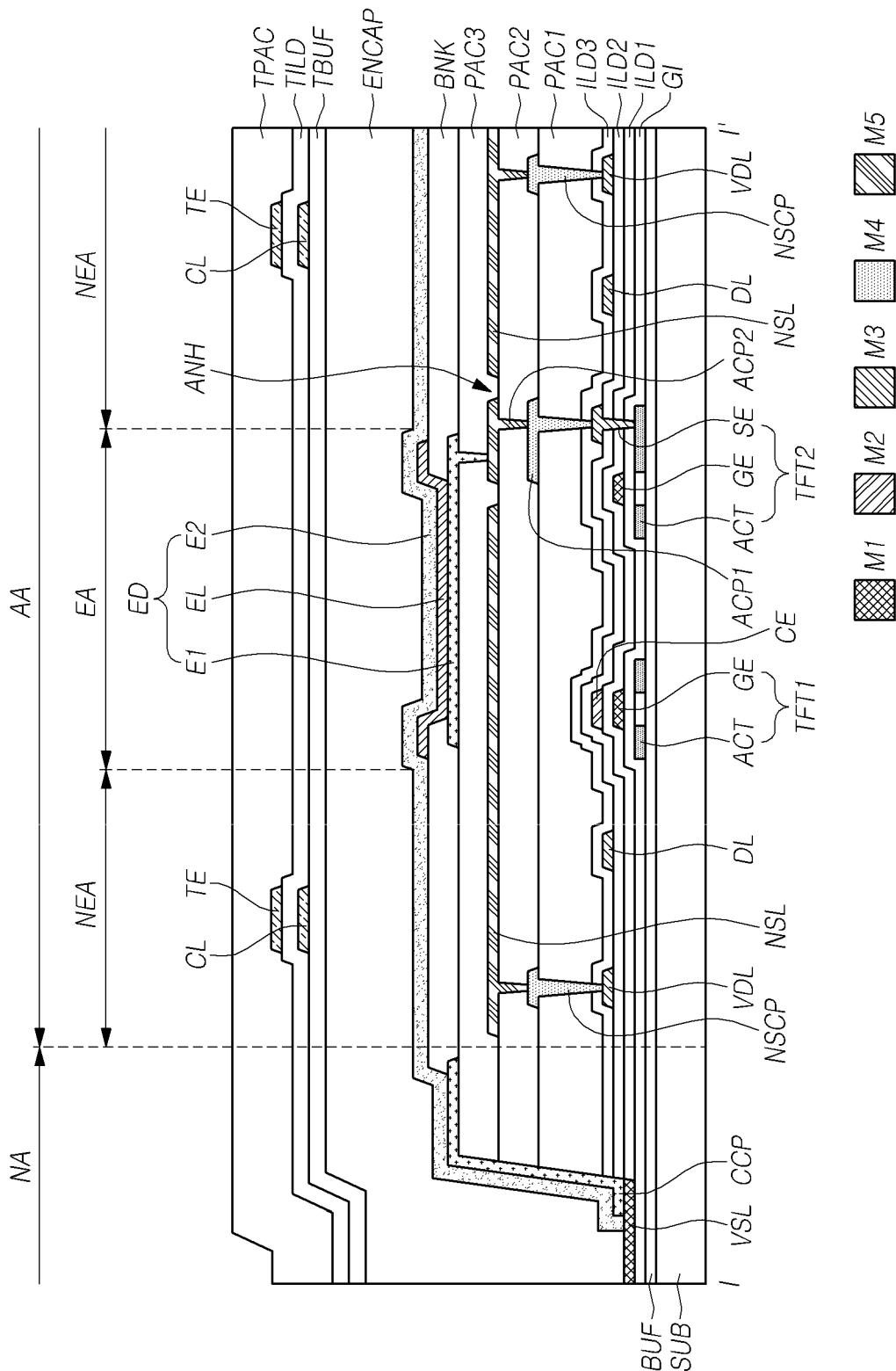
FIG. 6 is another example cross-sectional view taken along line I-I' illustrated in FIG. 3.

Referring to FIG. 6, a fifth metal layer M5 may be located between the fourth metal layer M4 and a layer in which the light emitting element ED is disposed. A third planarization layer PAC3 may be located on the fifth metal layer M5.

A noise shielding layer NSL may be disposed using the fifth metal layer M5.

The noise shielding layer NSL may be disposed in an area other than an area in which an anode connection pattern ACP for interconnecting the second thin film transistor TFT2 and the anode layer E1 of the light emitting element ED is disposed.

For example, the second thin film transistor TFT2 and the anode layer E1 of the light emitting element ED may be electrically connected by a first anode connection pattern ACP1 and a second anode connection pattern ACP2.

The first anode connection pattern ACP1 may be disposed using the fourth metal layer M4.

The second anode connection pattern ACP2 may be disposed using the fifth metal layer M5.

The noise shielding layer NSL may be disposed in an area other than an area in which the second anode connection pattern ACP2 is disposed. The noise shielding layer NSL may be disposed to be separated from the second anode connection pattern ACP2. The noise shielding layer NSL may include a plurality of anode holes ANH located in areas corresponding to second anode connection patterns ACP2.

In one or more embodiments, the noise shielding layer NSL may include an additional portion disposed using the fourth metal layer M4. For example, such an additional portion of the noise shielding layer NSL may be disposed on the first planarization layer PAC1 using the fourth metal layer M4.

The noise shielding layer NSL may be electrically connected to the first power line VDL in the active area AA.

For example, the noise shielding layer NSL may be electrically connected to the first power line VDL through a noise shielding connection pattern NSCP. For example, the noise shielding connection pattern NSCP may be disposed using the fourth metal layer M4.

Thus, the noise shielding layer NSL may be disposed using various metal layers under the light emitting element ED.

As the noise shielding layer NSL is located under the light emitting element ED, the noise shielding layer NSL may be disposed while overlapping a portion of the cathode layer E2 overlapping the anode layer E1. Since the noise shielding layer NSL is disposed to overlap the cathode layer E2 in an area other than an area in which the anode connection pattern ACP is disposed, coupling between at least one signal line and the cathode layer E2 can be blocked.

The noise shielding layer NSL may be disposed in a structure in which a constant voltage other than the first driving voltage VDD is supplied to the noise shielding layer NSL.

Figure 7:
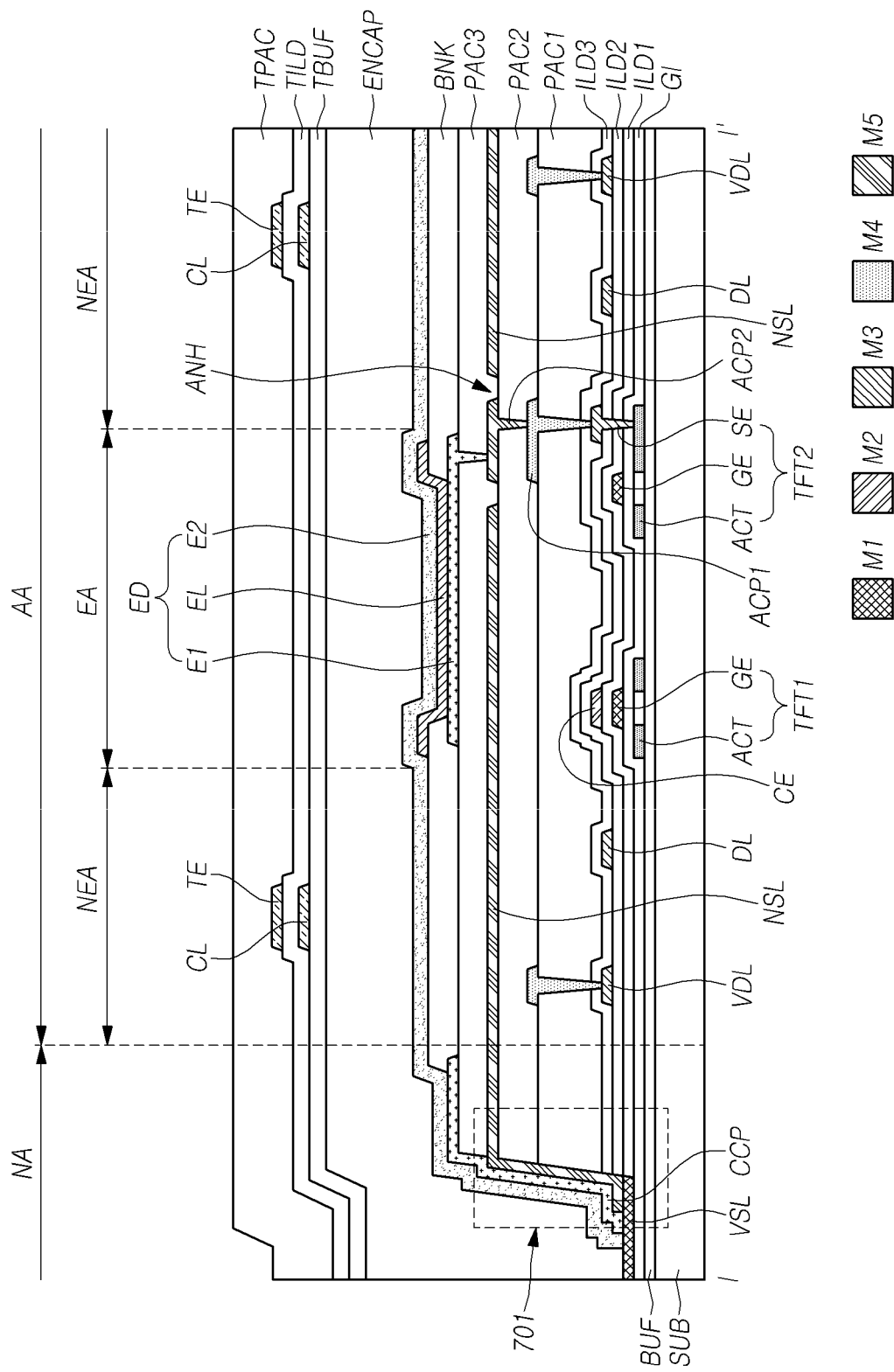
FIG. 7 is another example cross-sectional view taken along line I-I' illustrated in FIG. 3.

Referring to FIG. 7, a noise shielding layer NSL may be disposed using the fifth metal layer M5. For convenience of explanation, in FIG. 7, although an example in which the noise shielding layer NSL is disposed using the fifth metal layer M5 is described, however, the structure of FIG. 7 may also be applied in examples where the noise shielding layer NSL is disposed using another metal layer (e.g., the fourth metal layer M4).

The noise shielding layer NSL may extend from the active area AA to the non-active area NA.

For example, the noise shielding layer NSL may be electrically connected to a cathode connection pattern CCP in the non-active area NA, as indicated by reference number 701. The cathode connection pattern CCP may include a same material as the anode layer E1.

In one or more embodiments, as indicated by reference number 701, the noise shielding layer NSL may be electrically connected to the second power line VSL in the non-active area NA. The second power line VSL may be disposed using the first metal layer M1.

The noise shielding layer NSL may be electrically connected to the second power line VSL or the cathode layer E2 in the non-active area NA. The second driving voltage VSS (see FIG. 2) may be supplied to the noise shielding layer NSL. A structure in which a constant voltage is supplied to the noise shielding layer NSL may be implemented without forming a contact hole for an electrical connection between the noise shielding layer NSL and a power line in the active area AA.

The noise shielding layer NSL may receive a constant voltage through a signal line other than the first power line VDL or the second power line VSL.

Figure 8:
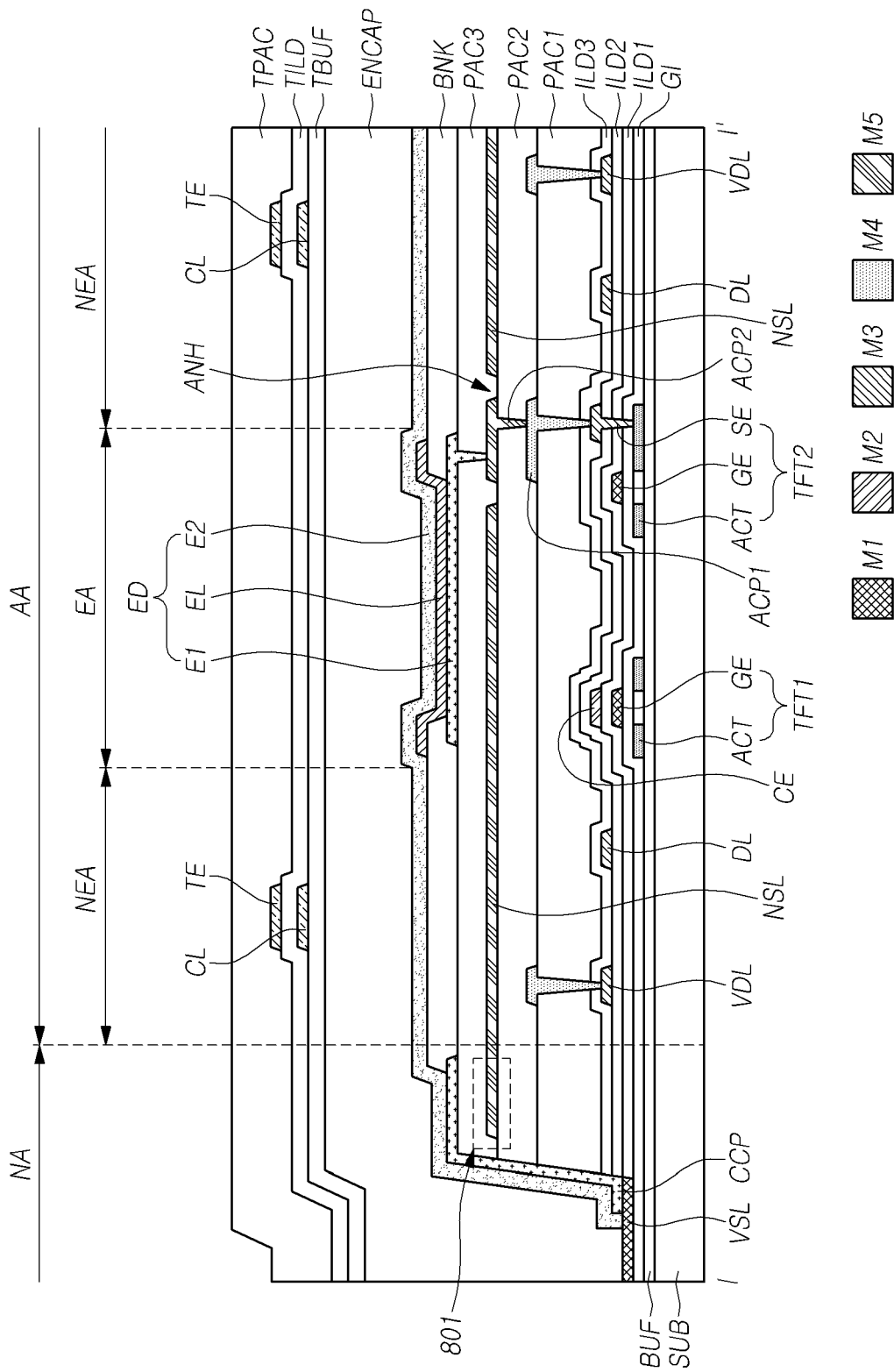
FIG. 8 is another example cross-sectional view taken along line I-I' illustrated in FIG. 3.

Referring to FIG. 8, a noise shielding layer NSL may be disposed using the fifth metal layer M5. For convenience of explanation, in FIG. 8, although an example in which the noise shielding layer NSL is disposed using the fifth metal layer M5 is described, however, the structure of FIG. 8 may also be applied in examples where the noise shielding layer NSL is disposed using another metal layer (e.g., the fourth metal layer M4).

The noise shielding layer NSL may be disposed to extend from the active area AA to the non-active area NA, as indicated by reference number 801.

The noise shielding layer NSL may not be connected to the first power line VDL or the second power line VSL. The noise shielding layer NSL may be disposed to extend to an area in which at least one pad is disposed in the non-active area NA. The noise shielding layer NSL may be electrically connected to any one pad and can receive a constant voltage through the pad. The noise shielding layer NSL may be disposed using at least one metal layer other than the fifth metal layer M5 in a path connected to the pad.

Thus, a structure for supplying a constant voltage to the noise shielding layer NSL may be formed in various forms.

In one or more embodiments, the noise shielding layer NSL may be electrically connected to the cathode layer E2 in the active area AA to reduce resistance of the cathode layer E2. As the resistance of the cathode layer E2 is reduced, even when the cathode layer E2 is coupled with a signal line, a range in which the voltage of the cathode layer E2 fluctuates can be reduced.

Figure 9:
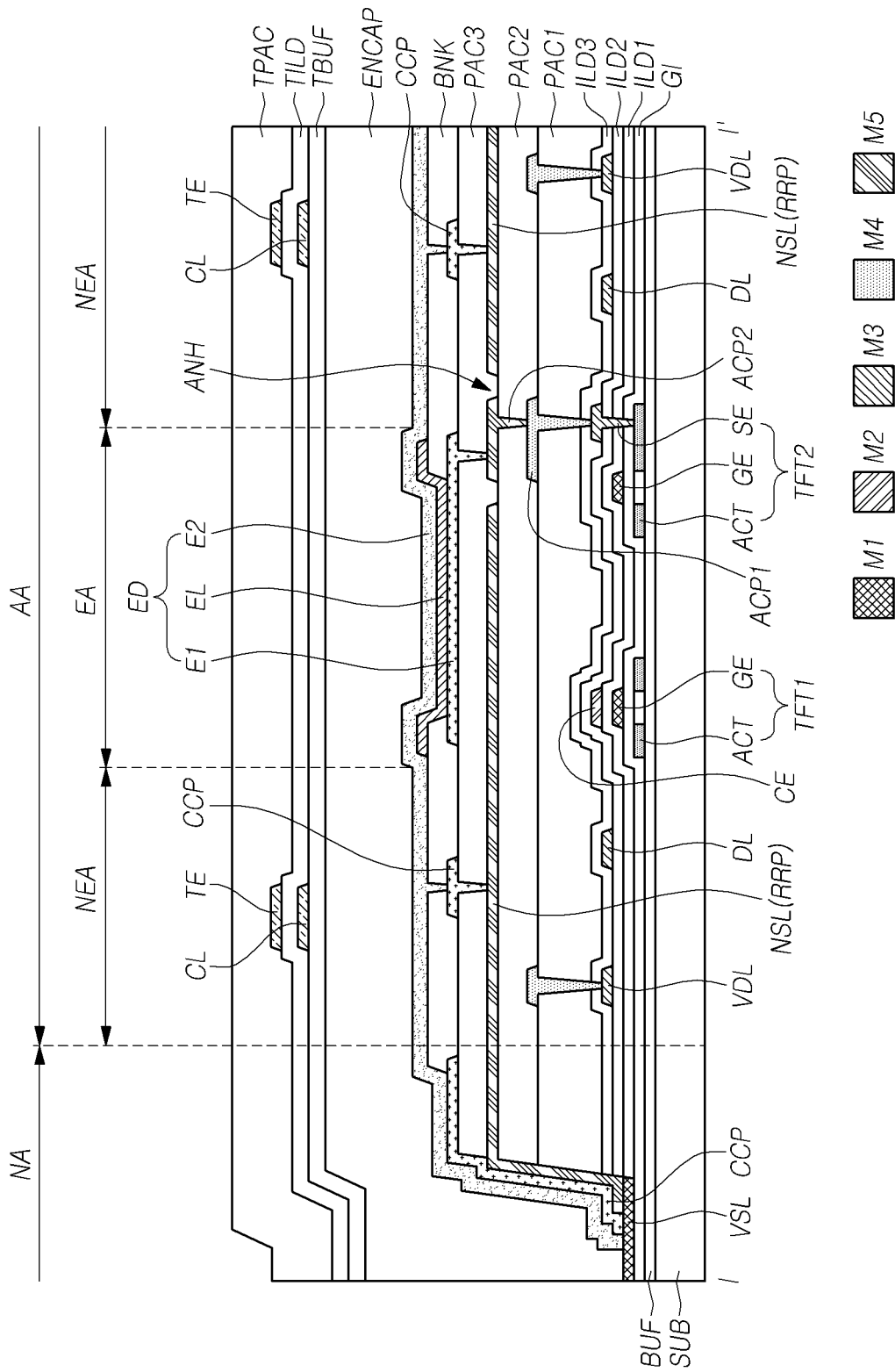
FIG. 9 is another example cross-sectional view taken along line I-I' illustrated in FIG. 3.

Referring to FIG. 9, a noise shielding layer NSL may be disposed using the fifth metal layer M5.

The noise shielding layer NSL may extend to the non-active area NA. The noise shielding layer NSL may be electrically connected to the second power line VSL, and/or a cathode connection pattern CCP in the non-active area NA.

In one or more embodiments, the noise shielding layer NSL may be connected to the cathode layer E2 through the cathode connection pattern CCP in the active area AA. The noise shielding layer NSL may be electrically connected to the cathode layer E2 at a plurality of locations in the active area AA.

The cathode connection pattern CCP located in the active area AA may be disposed using a same material as the anode layer E1. The cathode connection pattern CCP may be connected to the cathode layer E2 through a hole formed in the bank layer BNK. The cathode connection pattern CCP may be connected to the noise shielding layer NSL through a hole formed in the third planarization layer PAC3.

As the cathode layer E2 is deposited after one or more holes are formed in the bank layer BNK, the cathode layer E2 can contact the cathode connection pattern CCP. The emission layer EL may include a plurality of layers (e.g., a hole injection layer, an electron injection layer, and the like). In one or more embodiments, one or more (or a respective portion of the one or more) of the plurality of layers included in the emission layer EL may be located between the cathode layer E2 and the cathode connection pattern CCP.

The noise shielding layer NSL can block direct coupling between at least signal line located under the noise shielding layer NSL and the cathode layer E2.

The noise shielding layer NSL may be connected to the cathode layer E2 at a plurality of locations in the active area AA, this configuration leading the resistance of the cathode layer E2 to be reduced. In this case, the noise shielding layer NSL may also be referred to as a resistance reduction pattern RRP.

As the noise shielding layer NSL serving as a resistance reduction pattern RRP can reduce the resistance of the cathode layer E2, even when the cathode layer E2 is coupled with the signal line, a voltage at the cathode layer E2 may not fluctuate, or a range in which the voltage at the cathode layer E2 fluctuates can be reduced.

Thus, the noise shielding layer NSL serving as the resistance reduction pattern RRP can reduce the resistance of the cathode layer E2, and reduce or prevent touch sensing by at least one touch electrode TE on the encapsulation layer ENCAP from being affected by coupling between the signal line located under the light emitting element ED and the cathode layer E2.

In one or more embodiments, the noise shielding layer NSL may be disposed separately from a structure for reducing the resistance of the cathode layer E2.

Figure 10:
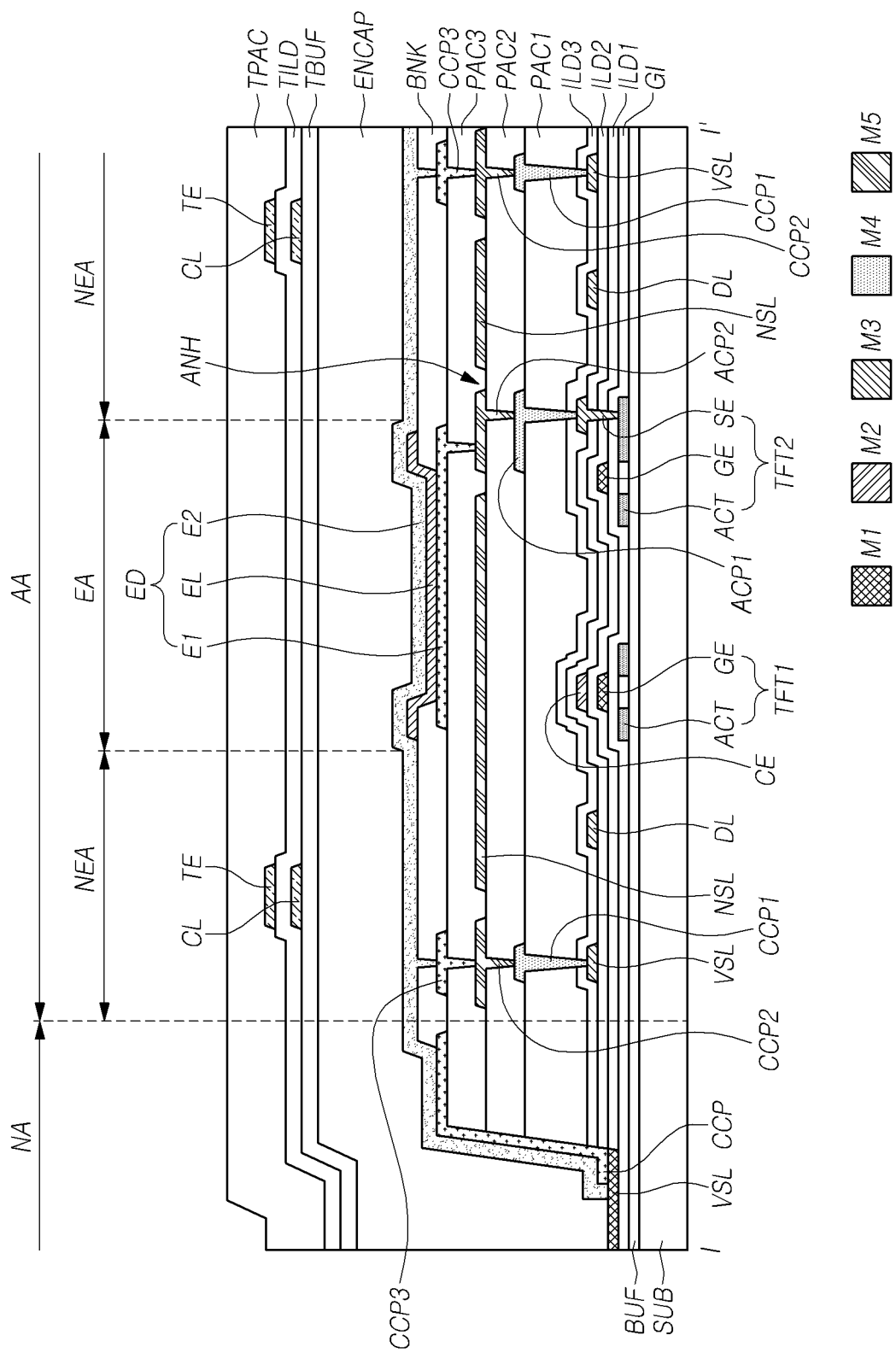
FIG. 10 is another example cross-sectional view taken along line I-I' illustrated in FIG. 3.

Referring to FIG. 10, in one or more embodiments, a noise shielding layer NSL may be disposed using the fifth metal layer M5. In one or more embodiments, the noise shielding layer NSL may be disposed using another metal layer such as the fourth metal layer M4.

A second power line VSL may be located in the active area AA.

The second power line VSL may be electrically connected to the cathode layer E2 in the active area AA. The second power line VSL may be electrically connected to the cathode layer E2 through at least one cathode connection pattern CCP.

For example, the second power line VSL may be electrically connected to the cathode layer E2 through a first cathode connection pattern CCP1, a second cathode connection pattern CCP2, and a third cathode connection pattern CCP3.

The first cathode connection pattern CCP1 may be disposed using, for example, the fourth metal layer M4. The second cathode connection pattern CCP2 may be disposed using, for example, the fifth metal layer M5. The third cathode connection pattern CCP3 may be disposed using, for example, a same material as the anode layer E1.

Resistance of the cathode layer E2 can be reduced by the structure in which the cathode layer E2 is connected to the second power line VSL through the cathode connection patterns (CCP1, CCP2, and CCP3) in the active area AA.

The noise shielding layer NSL may be disposed using any one layer among layers in which the cathode connection patterns (CCP1, CCP2, and CCP3) are disposed.

The noise shielding layer NSL may be disposed in an area other than one or more areas in which one or more cathode connection patterns CCP are disposed and one or more areas in which one or more anode connection patterns ACP are disposed. The noise shielding layer NSL can block coupling between at least one signal line and the cathode layer E2.

For example, in the structure where the noise shielding layer NSL is disposed separately from the cathode layer E2, a constant voltage may be applied to the noise shielding layer NSL through a separate signal line.

In another example, the first driving voltage VDD (see FIG. 2) may be applied to the noise shielding layer NSL.

Figure 11:
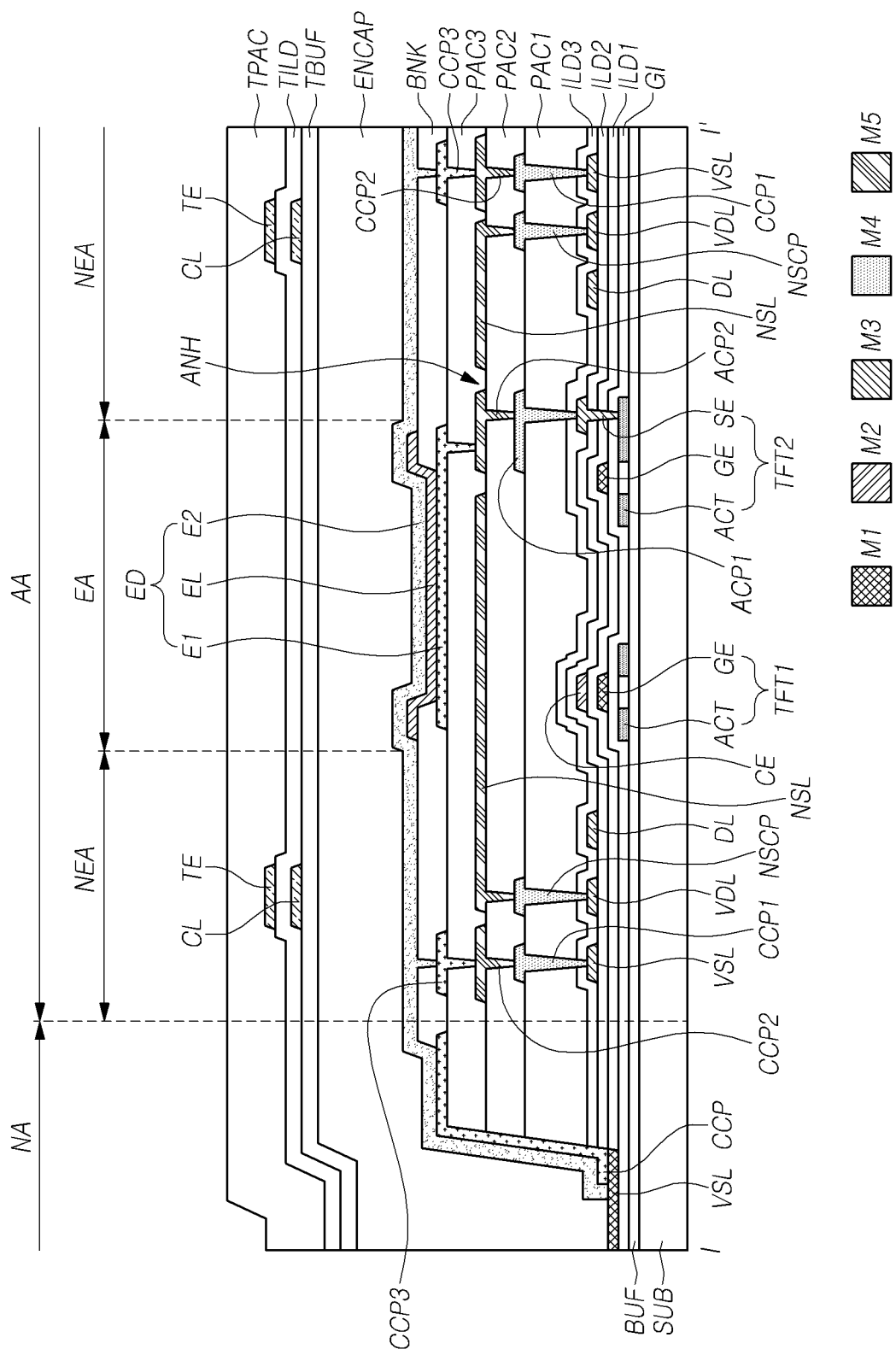
FIG. 11 is another example cross-sectional view taken along line I-I' illustrated in FIG. 3.

Referring to FIG. 11, in one or more embodiments, a noise shielding layer NSL may be disposed using the fifth metal layer M5. In one or more embodiments, the noise shielding layer NSL may be disposed using the fourth metal layer M4.

The noise shielding layer NSL may be electrically connected to a first power line VDL through a noise shielding connection pattern NSCP in the active area AA.

The cathode layer E2 may be electrically connected to the second power line VSL through the plurality of cathode connection patterns (CCP1, CCP2, and CCP3) in the active area AA.

Thus, in the active area AA, the noise shielding layer NSL may be electrically connected to the first power line VDL, and the cathode layer E2 is electrically connected to the second power line VSL.

Coupling between at least one signal line and the cathode layer E2 can blocked by the noise shielding layer NSL, and thereby, a structure in which the resistance of the cathode layer E2 is reduced can be provided.

In one or more embodiments, in a structure in which a second power line VSL (e.g., the second power line VSL of the active area AA in FIGS. 9 and 10) is not disposed in the active area AA, a structure in which a noise shielding layer NSL and a resistance reduction pattern RRP are separately disposed may be provided.

Figure 12:
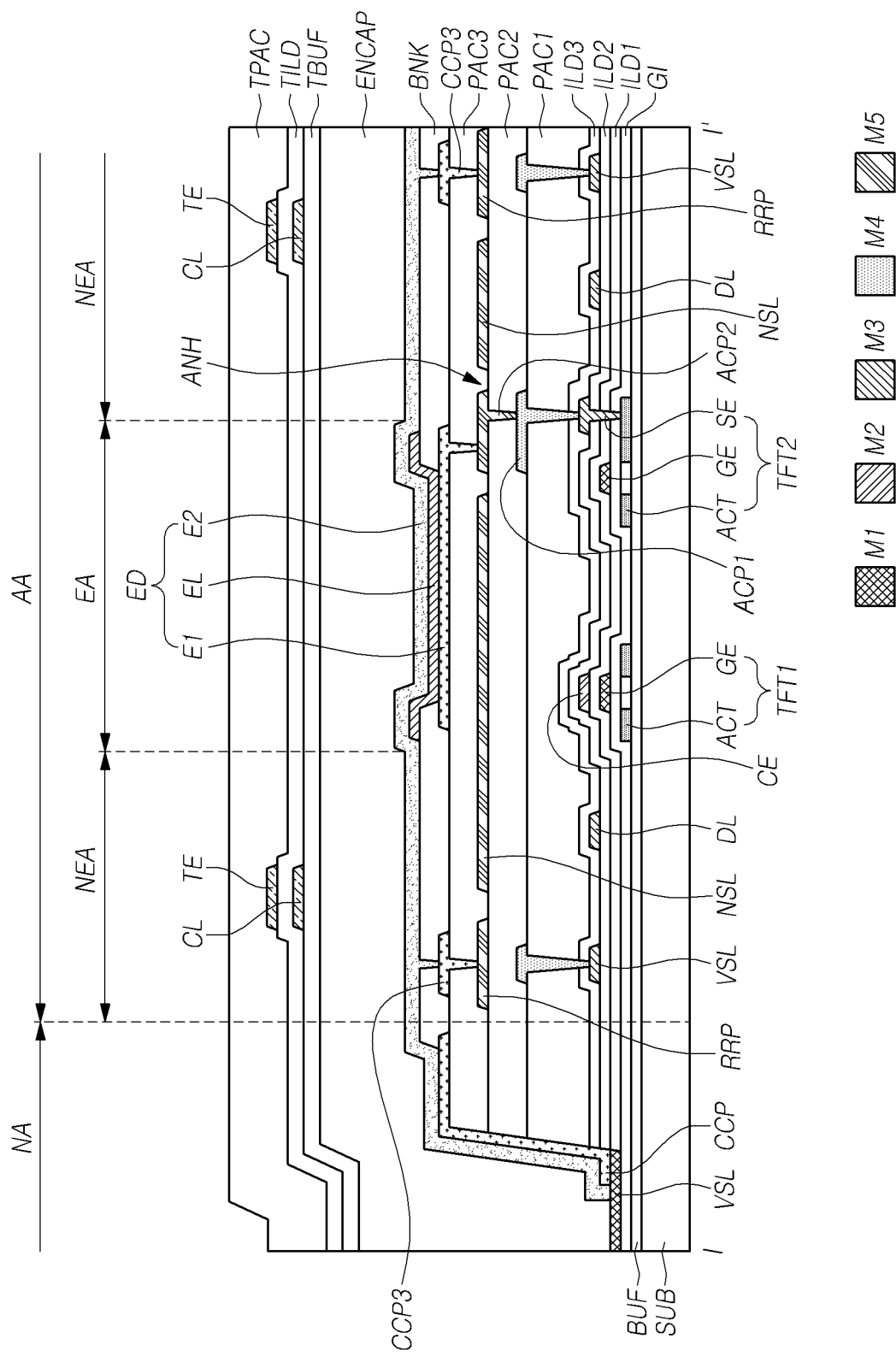
FIG. 12 is yet another example cross-sectional view taken along line I-I' illustrated in FIG. 3.

For example, referring to FIG. 12, in one or more embodiments, a noise shielding layer NSL may be disposed using the fifth metal layer M5. A resistance reduction pattern RRP may be also disposed using the fifth metal layer M5.

The noise shielding layer NSL and the resistance reduction pattern RRP may be disposed to be separated from each other.

The resistance reduction pattern RRP may be electrically connected to the cathode layer E2 through a cathode connection pattern CCP3.

For example, a constant voltage may be applied to the noise shielding layer NSL through a separate signal line. In another example, the first driving voltage VDD (see FIG. 2) may be applied to the noise shielding layer NSL through a first power line VDL.

The noise shielding layer NSL may be disposed in an area other than areas in which the resistance reduction pattern RRP and the anode connection pattern ACP are disposed. In the structure in which the resistance reduction pattern RRP is disposed for reducing the resistance of the cathode layer E2, coupling between the signal line and the cathode layer E2 can be reduced or eliminated by the noise shielding layer NSL.

As described above, according to the embodiments described above, coupling between a signal line under a light emitting element ED and an electrode of a light emitting element ED can be blocked by various structures of a noise shielding layer NSL located under the light emitting element ED. A fluctuation in a voltage of the electrode of the light emitting element ED by coupling between the signal line and the electrode of the light emitting element ED can be reduced or prevented. As a result, the occurrence of noise in a touch sensing signal detected by at least one touch electrode TE on the encapsulation layer ENCAP, which is caused by such a voltage fluctuation at the electrode of the light emitting element ED, can be reduced or prevented.

The noise shielding layer NSL may be disposed in an area other than areas in which various patterns under the light emitting element ED are disposed, and can block coupling between the signal line and the electrode of the light emitting element ED.

The noise shielding layer NSL may include a plurality of holes located in areas corresponding to various patterns disposed under the light emitting element ED.

In one or more embodiments, the noise shielding layer NSL may include at least one hole located in an area other than areas corresponding to various patterns disposed under the light emitting element ED.

Figure 13:
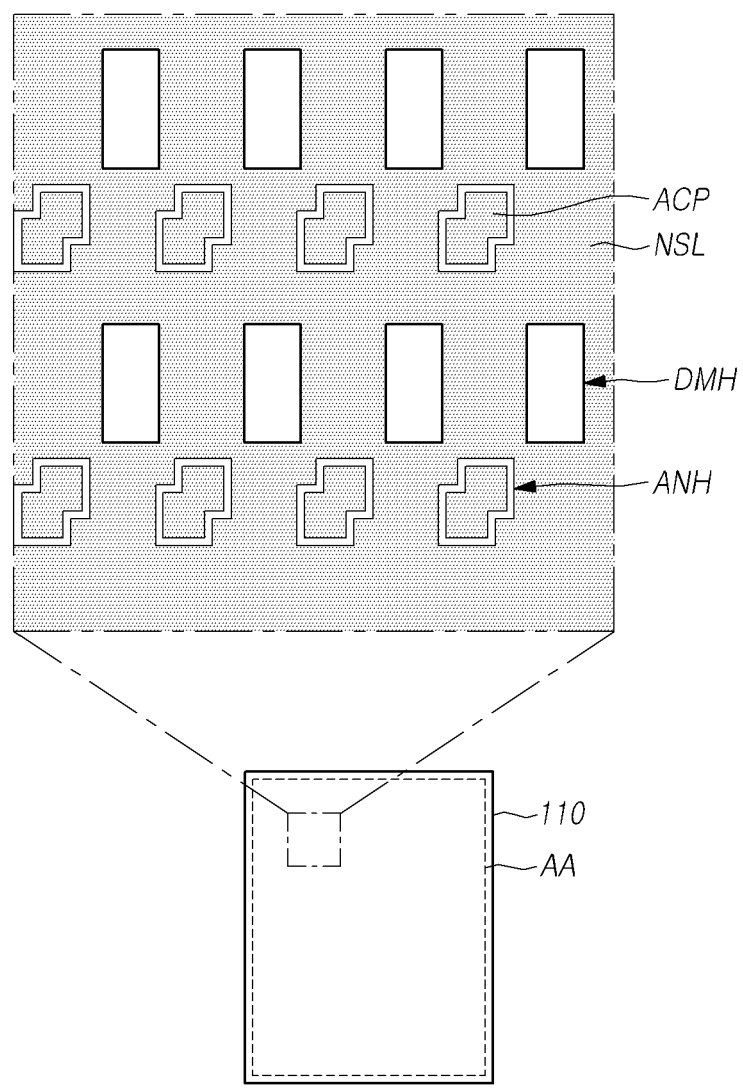
FIG. 13 is a plan view illustrating example structures in which a noise shielding layer is disposed in an active area of the touch display device according to one embodiment of the present disclosure.

FIGS. 13 and 14 are plan views illustrating example structures in which a noise shielding layer NSL is disposed in the active area AA of the touch display device 100 according to aspects of the present disclosure.

Referring to FIG. 13, a noise shielding layer NSL may be disposed in the active area AA.

As in the examples described above, the noise shielding layer NSL may be disposed using any one of metal layers located in between a layer in which at least one data line DL is disposed and a layer in which at least one light emitting element ED is disposed, such as the fourth metal layer M4, the fifth metal layer M5, or the like.

The noise shielding layer NSL may be disposed in an area other than the areas in which at least one anode connection pattern ACP is disposed.

The noise shielding layer NSL may include a plurality of anode holes ANH located in areas in which anode connection patterns ACP are located.

The noise shielding layer NSL may include at least one dummy hole DMH located in an area other than the areas in which the anode connection patterns ACP are disposed.

The dummy hole DMH may be located in an area other than an area overlapping a signal line located under the noise shielding layer NSL. For example, the dummy hole DMH may be located in an area other than an area overlapping a data line DL.

The dummy hole DMH included in the noise shielding layer NSL can provide a path through which gas generated in a process of at least one thin film transistor TFT located under the noise shielding layer NSL and/or one or more other processes is discharged.

Since the dummy hole DMH is located in an area other than the area overlapping the data line DL, the noise shielding layer NSL may be disposed such that the noise shielding layer NSL overlaps the data line DL. As the noise shielding layer NSL blocks coupling between the data line DL and the cathode layer E2 and provides a path for allowing gas to be discharged, these configurations can provide advantages of eliminating or reducing defects which may occur in the process of manufacturing one or more elements of the display panel 110.

In one or more embodiments, the dummy hole DMH may be located in a specific area according to types of the display panel 110.

Figure 14A:
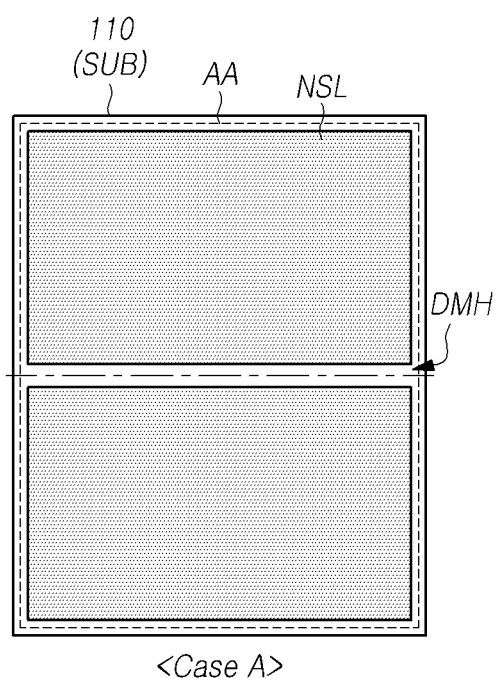
FIGS. 14A, 14B, and 14C are plan views illustrating example structures in which a noise shielding layer is disposed in an active area of the touch display device according to some embodiments of the present disclosure.
Figure 14B:
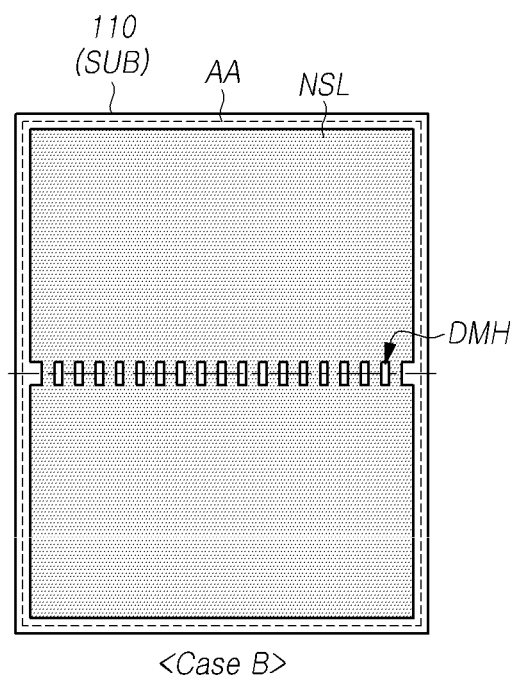
Figure 14C:
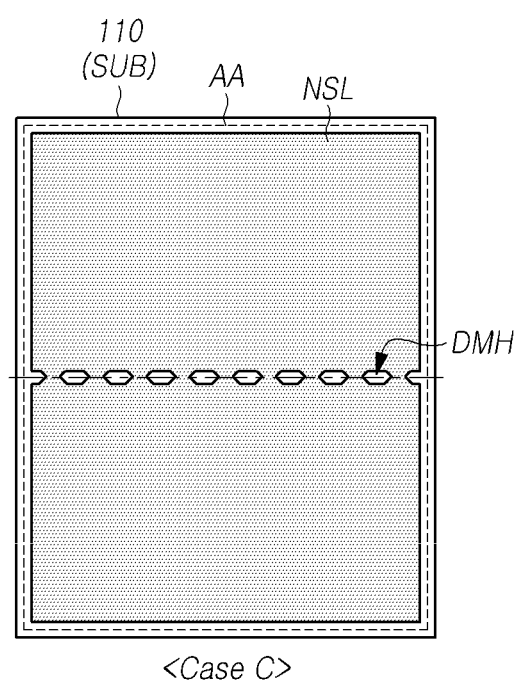

Referring to FIGS. 14A, 14B, and 14C, the touch display device 100 may be implemented in a form in which the display panel 110 is folded or bent. In an embodiment where a foldable or bendable display panel 110 is used in the touch display device 100, one or more dummy holes DMH included in the noise shielding layer NSL may be located in an area in which the substrate SUB is folded or bent.

In one embodiment, referring to Case A in FIG. 14A, a noise shielding layer NSL may be disposed in the active area AA. The noise shielding layer NSL may include a dummy hole DMH located in an area in which the substrate SUB is folded or bent. For example, the dummy hole DMH may overlap all, or at least a portion, of the folded area or bent area. The dummy hole DMH may be formed in a groove shape. The reduction of folding performance of the display panel 110 due to the arrangement of the noise shielding layer NSL can be reduced or prevented using the dummy hole DMH.

In another embodiment, referring to Case B in FIG. 14B, a plurality of dummy holes DMH may be located in an area in which the substrate SUB is folded or bent. For example, the dummy holes DMH may have a rectangular shape, but is not limited thereto. The dummy holes DMH may be located in an area other than an area overlapping at least one data line DL. For example, the dummy holes DMH may be disposed with a high density in an area in which the substrate SUB is folded or bent.

In another embodiment, referring to Case C in FIG. 14C, each of one or more dummy holes DMH may be disposed such that a length of the dummy hole in a direction along an area in which the substrate SUB is folded or bent is greater than a length of the dummy hole in a direction crossing the area in which the substrate SUB is folded or bent. An area of the noise shielding layer NSL overlapping a portion in which the substrate SUB is folded or bent can be further reduced.

As described above, the noise shielding layer NSL may be located in an area in which a signal line such as a data line DL overlaps the cathode layer E2 of a light emitting element ED, and may include one or more dummy holes DMH located in an area other than the area in which the data line DL and the cathode layer E2 overlap each other or in a folded or bent area of the substrate SUB.

The noise shielding layer NSL can reduce or prevent one or more signals for display driving from reducing the performance of touch sensing. Further, the noise shielding layer NSL can reduce or prevent the occurrence of defects in the process of manufacturing one or more elements of the display panel 110 or defects related to types of display panel 110.

The embodiments described above will be briefly described as follows.

According to the embodiments described herein, the touch display device 100 may include a substrate SUB including an active area AA in which a plurality of subpixels SP are disposed and a non-active area NA located outside of the active area AA; a plurality of data lines DL disposed over the substrate SUB; a plurality of light emitting elements ED located over the plurality of data lines DL, each of the plurality of light emitting elements including an anode layer E1, an emission layer EL, and a cathode layer E2; an encapsulation layer ENCAP disposed on the plurality of light emitting elements ED; a plurality of touch electrodes TE disposed on the encapsulation layer ENCAP; and a noise shielding layer NSL located between a layer in which the plurality of data lines DL are disposed and a layer in which the plurality of light emitting elements ED are disposed.

For example, the noise shielding layer NSL may be electrically connected to a first power line VDL located under the noise shielding layer NSL in the active area AA. In this example, the cathode layer E2 may be electrically connected to a second power line VSL located under the noise shielding layer NSL in the active area AA.

In another example, the noise shielding layer NSL may be electrically connected to a second power line VSL electrically connected to the cathode layer E2 in the non-active area NA.

In another example, the noise shielding layer NSL may be electrically connected to the cathode layer E2 in the active area AA.

In another example, the noise shielding layer NSL may be electrically connected to a pad located in the non-active area NA and receive a constant voltage through the pad.

The touch display device 100 may be further include at least one anode connection pattern ACP located between a layer where the plurality of data lines DL are disposed and a layer where the plurality of light emitting elements ED are disposed, and electrically connected to the anode layer E1.

The noise shielding layer NSL may be disposed in an area other than the areas in which the anode connection pattern ACP is disposed.

The noise shielding layer NSL may be separated from the anode connection patterns ACP.

The noise shielding layer NSL may include a plurality of anode holes ANH located in areas corresponding to anode connection patterns ACP.

The noise shielding layer NSL may include at least one dummy hole DMH located in an area other than the areas corresponding to the anode connection patterns ACP.

The at least one dummy hole DMH may be located in an area other than an area overlapping a plurality data lines DL.

The at least one dummy hole DMH may overlap an area in which the substrate SUB is folded or bent.

The touch display device 100 may further include a first anode connection pattern ACP1 located between a layer in which the plurality of data lines DL are disposed and a layer in which the plurality of light emitting elements ED are disposed, and a second anode connection pattern ACP2 located between a layer in which the first anode connection pattern ACP1 is disposed and the layer in which the plurality of light emitting elements ED is disposed and electrically interconnecting the first anode connection pattern ACP1 and the anode layer E1.

The noise shielding layer NSL may be disposed in an area other than the areas in which the second anode connection pattern ACP2 is disposed.

In one embodiment, the touch display device 100 may further include a cathode connection pattern CCP electrically interconnecting the noise shielding layer NSL and the cathode layer E2, and including a same material as the anode layer E1.

In another embodiment, the touch display device 100 further includes a resistance reduction pattern RRP located in a layer in which the noise shielding layer NSL is disposed, insulated from the noise shielding layer NSL, and electrically connected to the cathode layer E2.

The touch display device 100 may further include two or more cathode connection patterns CCP electrically interconnecting the cathode layer E2 and a power line located under the noise shielding layer NSL. The noise shielding layer NSL may be located in a layer in which one of the two or more cathode connection patterns CCP is disposed.

The touch display device 100 may further include a plurality of thin film transistors TFT on the substrate SUB. One or more of the plurality of thin film transistors TFT may be electrically connected to the anode layer E1 in an area other than an area overlapping the noise shielding layer NSL.

According to the embodiments described herein, the touch display device 100 may include a substrate SUB, a plurality of thin film transistors TFT disposed over the substrate SUB, a plurality of light emitting elements ED disposed over the plurality of thin film transistors TFT, an encapsulation layer ENCAP disposed on the plurality of light emitting elements ED, a plurality of touch electrodes TE disposed on the encapsulation layer ENCAP, at least one connection pattern for electrically connecting any one of the plurality of thin film transistors TFT to any one of the plurality of light emitting elements ED, and a noise shielding layer NSL located in a layer in which the at least one connection pattern is disposed, insulated from the at least one connection pattern, and overlapping at least one, or a respective portion of the at least one, of the plurality of light emitting elements ED.

According to the embodiments described herein, the touch display device 100 may include a substrate SUB including an active area AA in which a plurality of subpixels SP are disposed and a non-active area NA located outside of the active area AA, a plurality of signal lines disposed over the substrate SUB, a plurality of light emitting elements ED disposed over the plurality of signal lines, an encapsulation layer ENCAP disposed on the plurality of light emitting elements ED, a plurality of touch electrodes TE disposed on the encapsulation layer ENCAP, and a noise shielding layer NSL located between a layer in which the plurality of signal lines are disposed and a layer in which the plurality of light emitting elements ED are disposed, overlapping at least one of the plurality of signal lines, electrically connected to the overlapped at least one signal line in a portion of the active area AA, and insulated from the remaining one or more signal lines except for the overlapped at least one signal line among the plurality of signal lines.

According to the embodiments described herein, the touch display device 100 may include a substrate SUB, a plurality of data lines DL disposed over the substrate SUB, a plurality of light emitting elements ED disposed over the plurality of data lines DL, an encapsulation layer ENCAP disposed on the plurality of light emitting elements ED, a plurality of touch electrodes TE disposed on the encapsulation layer ENCAP, and a noise shielding layer NSL disposed between a layer in which the plurality of data lines DL are disposed and a layer in which the plurality of light emitting elements ED are disposed.

According to the embodiments described herein, the touch display device 100 may include a substrate SUB, at least one power line disposed over the substrate SUB, a plurality of light emitting elements ED disposed over the at least one power line, an encapsulation layer ENCAP disposed on the plurality of light emitting elements ED, a plurality of touch electrodes TE disposed on the encapsulation layer ENCAP, and a noise shielding layer NSL disposed between a layer in which the at least one power line is disposed and a layer in which the plurality of light emitting elements ED are disposed, and electrically connected to the at least one power line.

According to the embodiments described herein, the touch display device 100 may include a substrate SUB, a plurality of thin film transistors TFT disposed over the substrate SUB, a plurality of light emitting elements ED disposed over the plurality of thin film transistors TFT, each of the plurality of light emitting elements ED including an anode layer E1, an emission layer EL, and a cathode layer E2, an encapsulation layer ENCAP disposed on the plurality of light emitting elements ED, a plurality of touch electrodes TE disposed on the encapsulation layer ENCAP, a noise shielding layer NSL disposed between a layer in which the plurality of thin film transistors TFT are disposed and a layer in which the plurality of light emitting elements ED are disposed, and a plurality of anode connection patterns ACP disposed in a layer in which the noise shielding layer NSL is disposed, and electrically interconnecting at least one of the plurality of the thin film transistors TFT and the anode layer E1.

According to the embodiments described herein, the touch display device 100 may include a substrate SUB, a plurality of display signal lines disposed over the substrate SUB, a plurality of light emitting elements ED disposed over the plurality of display signal lines, an encapsulation layer ENCAP disposed on the plurality of light emitting elements ED, a plurality of touch electrodes TE disposed on the encapsulation layer ENCAP, and a noise shielding layer NSL disposed between a layer in which the plurality of display signal lines are disposed and a layer in which the plurality of light emitting elements ED are disposed.

According to the embodiments described herein, the touch display device 100 may include a substrate SUB, a plurality of thin film transistors TFT disposed over the substrate SUB, a plurality of light emitting elements ED disposed over the plurality of thin film transistors TFT, an encapsulation layer ENCAP disposed on the plurality of light emitting elements ED, a plurality of touch electrodes TE disposed on the encapsulation layer ENCAP, and a noise shielding layer NSL disposed between a layer in which the plurality of thin film transistors TFT are disposed and a layer in which the plurality of light emitting elements ED are disposed.

According to the embodiments described herein, the touch display device 100 may include a substrate SUB, a plurality of power lines disposed over the substrate SUB, a plurality of light emitting elements ED disposed over the plurality of power lines, an encapsulation layer ENCAP disposed on the plurality of light emitting elements ED, a plurality of touch electrodes TE disposed on the encapsulation layer ENCAP, and a noise shielding layer NSL disposed between a layer in which the plurality of power lines are disposed and a layer in which the plurality of light emitting elements ED are disposed, and receiving a signal different from a signal supplied to the plurality of power lines.

According to the embodiments described herein, the touch display device 100 may include a substrate SUB, a plurality of data lines DL disposed over the substrate SUB, a plurality of light emitting elements ED disposed over the plurality of data lines DL, each of the plurality of light emitting elements ED including an anode layer E1, an emission layer EL, and a cathode layer E2, an encapsulation layer ENCAP disposed on the plurality of light emitting elements ED, a plurality of touch electrodes TE disposed on the encapsulation layer ENCAP, and a noise shielding layer NSL disposed between the plurality of data lines DL and the anode layer E1, and including a plurality of holes.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes only. That is, the disclosed embodiments are intended to illustrate the scope of the technical features of the present disclosure. Thus, the scope of the present disclosure is not limited to the embodiments shown, but is to be accorded the widest scope consistent with the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device comprising:
   a substrate comprising an active area in which a plurality of subpixels is disposed and a non-active area located outside of the active area;
   a plurality of data lines disposed over the substrate;
   a plurality of light emitting elements located over the plurality of data lines, each of the plurality of light emitting elements including an anode layer, an emission layer, and a cathode layer;
   an encapsulation layer disposed on the plurality of light emitting elements;
   a plurality of touch electrodes disposed on the encapsulation layer; and
   a noise shielding layer located between a layer in which the plurality of data lines is disposed and a layer in which the anode layer is disposed,
   wherein the noise shielding layer is electrically connected to a first power line located under the noise shielding layer in the active area.

2. The touch display device of claim 1, wherein the cathode layer is electrically connected to a second power line located under the noise shielding layer in the active area.

3. The touch display device of claim 1, further comprising: an anode connection pattern located between a layer in which the plurality of data lines are disposed and a layer in which the plurality of light emitting elements are disposed, and electrically connected to the anode layer,
   wherein the noise shielding layer is located in a layer in which the anode connection pattern is disposed.

4. The touch display device of claim 3, wherein the noise shielding layer is separated from the anode connection pattern.

5. The touch display device of claim 3, wherein the noise shielding layer comprises a plurality of anode holes, each of which is located in an area corresponding to the anode connection pattern.

6. The touch display device of claim 3, wherein the noise shielding layer comprises at least one dummy hole located in an area other than an area corresponding to the anode connection pattern.

7. The touch display device of claim 6, wherein the at least one dummy hole is located in an area other than an area overlapping the plurality of data lines.

8. The touch display device of claim 6, wherein the at least one dummy hole overlaps an area in which the substrate is folded or bent.

9. The touch display device of claim 1, further comprising:
   a first anode connection pattern located between a layer in which the plurality of data lines is disposed and a layer in which the plurality of light emitting elements are disposed; and
   a second anode connection pattern located between a layer in which the first anode connection pattern is disposed and the layer in which the plurality of light emitting elements are disposed, and electrically interconnecting the first anode connection pattern and the anode layer,
   wherein the noise shielding layer is located in a layer in which the second anode connection pattern is disposed.

10. The touch display device of claim 9, further comprising: a cathode connection pattern electrically interconnecting the noise shielding layer and the cathode layer, and including a same material as the anode layer.

11. The touch display device of claim 9, further comprising a resistance reduction pattern located in a layer in which the noise shielding layer is disposed, insulated from the noise shielding layer, and electrically connected to the cathode layer.

12. The touch display device of claim 1, further comprising: two or more cathode connection patterns electrically interconnecting the cathode layer and a power line located under the noise shielding layer,
   wherein the noise shielding layer is located in a layer in which one of the two or more cathode connection patterns is disposed.

13. The touch display device of claim 1, further comprising: a plurality of thin film transistors over the substrate,
   wherein at least one of the plurality of thin film transistors is electrically connected to the anode layer in an area other than an area overlapping the noise shielding layer.

14. A touch display device comprising:

a substrate comprising an active area in which a plurality of subpixels is disposed;

a plurality of thin film transistors disposed over the substrate, each thin film transistor of the plurality of thin film transistors including a gate electrode, a source electrode, and a drain electrode;

a plurality of light emitting elements disposed over the plurality of thin film transistors;

an encapsulation layer disposed on the plurality of light emitting elements;

a plurality of touch electrodes disposed on the encapsulation layer;

at least one connection pattern for electrically connecting either the source or drain electrode of any one of the plurality of thin film transistors to any one of the plurality of light emitting elements; and a noise shielding layer located in a layer in which the at least one connection pattern is disposed, insulated from the at least one connection pattern, and overlapping a respective portion of at least one light emitting element of the plurality of light emitting elements, wherein the noise shielding layer is electrically connected to a first power line located under the noise shielding layer in the active area.

15. A touch display device comprising:

a substrate comprising an active area in which a plurality of subpixels are disposed and a non-active area located outside of the active area;

a plurality of signal lines disposed over the substrate;

a plurality of light emitting elements disposed over the plurality of signal lines;

an encapsulation layer disposed on the plurality of light emitting elements;

a plurality of touch electrodes disposed on the encapsulation layer; and a noise shielding layer located between a layer in which the plurality of signal lines are disposed and a layer in which the plurality of light emitting elements are disposed, overlapping at least one of the plurality of signal lines, electrically connected to the overlapped at least one signal line in the active area, and insulated from the remaining one or more signal lines except for the overlapped at least one signal line among the plurality of signal lines.

* * * * *